(12) United States Patent
    Kim

(10) Patent No.: US 10,797,134 B2
(45) Date of Patent: Oct. 6, 2020

(54) INTEGRATED CIRCUIT DEVICES

(71) Applicant: Samsung Electronics Co., Ltd., Suwon-si, Gyeonggi-do (KR)

(72) Inventor: Myoung-soo Kim, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/106,168

(22) Filed: Aug. 21, 2018

(65) Prior Publication Data

US 2019/0206995 A1    Jul. 4, 2019

(30) Foreign Application Priority Data

Jan. 3, 2018 (KR) .................. 10-2018-0000899

(51) Int. Cl.
| | |
|---|---|
| *H01L 29/08* | (2006.01) |
| *H01L 29/06* | (2006.01) |
| *H01L 29/423* | (2006.01) |
| *H01L 29/45* | (2006.01) |
| *H01L 21/762* | (2006.01) |
| *H01L 29/78* | (2006.01) |
| *H01L 29/66* | (2006.01) |
| *H01L 21/768* | (2006.01) |
| *H01L 21/265* | (2006.01) |
| *H01L 21/02* | (2006.01) |
| *H01L 29/49* | (2006.01) |

(Continued)

(52) U.S. Cl.
CPC ........ *H01L 29/0847* (2013.01); *H01L 21/768* (2013.01); *H01L 21/76224* (2013.01); *H01L 29/0653* (2013.01); *H01L 29/42356* (2013.01); *H01L 29/45* (2013.01); *H01L 29/66568* (2013.01); *H01L 29/7833* (2013.01); *H01L 21/0274* (2013.01); *H01L 21/02164* (2013.01); *H01L 21/02271* (2013.01); *H01L 21/266* (2013.01); *H01L 21/26513* (2013.01); *H01L 21/3085* (2013.01); *H01L 21/32139* (2013.01); *H01L 21/32155* (2013.01); *H01L 29/42364* (2013.01); *H01L 29/4933* (2013.01); *H01L 29/665* (2013.01); *H01L 29/6656* (2013.01)

(58) Field of Classification Search
None
See application file for complete search history.

(56) References Cited

U.S. PATENT DOCUMENTS

| | | |
|---|---|---|
| 5,998,848 A | 12/1999 | Brown et al. |
| 8,106,465 B2 | 1/2012 | Tanaka |

(Continued)

FOREIGN PATENT DOCUMENTS

| | | |
|---|---|---|
| JP | 2000-101084 | 4/2000 |
| KR | 10-0917819 | 9/2009 |
| KR | 10-2015-0071052 | 6/2015 |

*Primary Examiner* — Nicholas J Tobergte
*Assistant Examiner* — Kien C Ly
(74) *Attorney, Agent, or Firm* — Myers Bigel, P.A.

(57) ABSTRACT

Integrated circuit devices are provided. An integrated circuit device includes a substrate and a device isolation film on the substrate. An active region of the substrate is defined by the device isolation film on the substrate and has a first width in a horizontal direction. A gate electrode is on the active region and has a second width equal to or less than the first width of the active region in the horizontal direction. The integrated circuit device includes an insulating spacer over the device isolation film and the active region.

18 Claims, 30 Drawing Sheets

(51) Int. Cl.
   *H01L 21/3213*   (2006.01)
   *H01L 21/027*    (2006.01)
   *H01L 21/3215*   (2006.01)
   *H01L 21/308*    (2006.01)
   *H01L 21/266*    (2006.01)

(56) References Cited

U.S. PATENT DOCUMENTS

| | | |
|---|---|---|
| 9,396,297 B2 | 7/2016 | Kang |
| 2001/0010381 A1 | 8/2001 | Jung et al. |
| 2001/0016397 A1 | 8/2001 | Kim et al. |
| 2003/0068874 A1 | 4/2003 | Jung et al. |
| 2008/0054411 A1 | 3/2008 | Jeong |
| 2010/0032745 A1* | 2/2010 | Sugimachi ......... G11C 16/0433 257/316 |
| 2010/0032772 A1 | 2/2010 | Tanaka |
| 2010/0084717 A1 | 4/2010 | Tanaka |
| 2014/0042506 A1 | 2/2014 | Ramberg et al. |
| 2014/0103440 A1 | 4/2014 | Chatterjee |
| 2015/0171809 A1 | 6/2015 | Song |
| 2017/0200650 A1* | 7/2017 | Chang ............... H01L 21/82346 |

* cited by examiner

X – X'

Y – Y'

INTEGRATED CIRCUIT DEVICES

CROSS-REFERENCE TO RELATED APPLICATION

This application claims the benefit of Korean Patent Application No. 10-2018-0000899, filed on Jan. 3, 2018, in the Korean Intellectual Property Office, the disclosure of which is hereby incorporated herein in its entirety by reference.

BACKGROUND

The present disclosure relates to integrated circuit devices and, more particularly, to integrated circuit devices that include a gate electrode for implementing an analog semiconductor device.

As the degree of integration of integrated circuit devices gradually increases with the development of the electronics industry, it may be beneficial to provide designs that improve the reliability of integrated circuit devices within reduced areas. In particular, display driver integrated circuits (DDIs) for driving display devices, such as liquid crystal display devices (LCDs) or plasma display panels (PDPs), are being developed. DDIs include high-voltage transistors that may operate at a high voltage of about 8 Volts (V) to about 200 V. High-voltage transistors included in driving devices such as DDIs may have modified lightly doped drain (MLDD), field lightly doped drain (FLDD), or double diffused drain (DDD) structures. High-voltage transistors having such structures, however, may suffer from a hump phenomenon.

SUMMARY

The inventive concepts provide an integrated circuit device which may have desired performance with a small/minimum area within a highly reduced area and provide excellent reliability, since the integrated circuit device reduces an occupation area of a high-voltage transistor and also inhibits/prevents a reduction of a threshold voltage by inhibiting/preventing formation of an undesired edge channel in the vicinity of an interface between a device isolation region and an active region in the high-voltage transistor and thus suppressing a hump phenomenon.

According to some embodiments of the inventive concepts, there is provided an integrated circuit device including a substrate and a device isolation film on the substrate. An active region of the substrate may be defined by the device isolation film on the substrate and may have a first width in a horizontal direction. The integrated circuit device may include a pair of source/drain regions in the active region. The integrated circuit device may include a gate electrode over a portion of the active region that is between the pair of source/drain regions. The gate electrode may have a second width equal to or less than the first width of the active region in the horizontal direction. The integrated circuit device may include an insulating spacer including a first spacer portion over the device isolation film and a second spacer portion over the active region. The first spacer portion and the second spacer portion may be on first and second sidewalls, respectively, of the gate electrode. The integrated circuit device may include an insulating film including a gate insulating portion between the active region and the gate electrode.

According to some embodiments of the inventive concepts, there is provided an integrated circuit device including a substrate including a trench region that defines an active region of the substrate. The active region may have a first width in a first horizontal direction. The integrated circuit device may include a device isolation film in the trench region. The integrated circuit device may include a gate electrode over the active region. The gate electrode may have a second width equal to or less than the first width of the active region in the first horizontal direction. The integrated circuit device may include an insulating spacer over the active region and the device isolation film. The insulating spacer may be on sidewalls of the gate electrode. The integrated circuit device may include a pair of source/drain regions in the active region. The pair of source/drain regions may be spaced apart from each other. The gate electrode may overlap a portion of the active region that is between the pair of source/drain regions. The integrated circuit device may include an insulating film on the active region and the device isolation film. The insulating film may include a gate insulating portion between the active region and the gate electrode. A vertical axis that extends through a border between an uppermost surface of the active region and the device isolation film in a vertical direction that is perpendicular to the first horizontal direction may be aligned with one of the sidewalls of the gate electrode or may extend through the insulating spacer.

According to some embodiments of the inventive concepts, there is provided an integrated circuit device including a substrate including a first active region and a second active region that are adjacent each other and spaced apart from each other in a first horizontal direction. The integrated circuit device may include a device isolation region between the first active region and the second active region. The integrated circuit device may include a first plurality of impurity diffusion regions in the first active region. The integrated circuit device may include a second plurality of impurity diffusion regions in the second active region. The integrated circuit device may include a first gate electrode over the first active region. The first gate electrode may have a width equal to or less than a width of the first active region in the first horizontal direction. The integrated circuit device may include a first insulating spacer on sidewalls of the first gate electrode and on the device isolation region. The integrated circuit device may include a second gate electrode over the second active region. The second gate electrode may have a width equal to or less than a width of the second active region in the first horizontal direction. The integrated circuit device may include a second insulating spacer on sidewalls of the second gate electrode and on the device isolation region. A separation distance between the first active region and the second active region in the first horizontal direction may be constant along a second horizontal direction that is perpendicular to the first horizontal direction. Moreover, a distance between the first gate electrode and the second gate electrode in the first horizontal direction may be equal to or greater than the separation distance.

The integrated circuit device according to the inventive concepts may reduce an occupation area of a transistor, may have desired performance with a small/minimum area within a reduced area by suppressing, in a transistor, the occurrence of a hump phenomenon due to formation of an undesired edge channel in the vicinity of an interface between the device isolation region and the active region, and may provide excellent reliability.

BRIEF DESCRIPTION OF THE DRAWINGS

Embodiments of the inventive concepts will be more clearly understood from the following detailed description taken in conjunction with the accompanying drawings in which:

FIGS. 6A, 7A, 8A, 9A, 10A, 11A, 12A, 13A, 14A, 15A, and 16A are cross-sectional views respectively illustrating configurations corresponding to a cross-section taken along the line X-X' of FIG. 1A, according to a process order, and FIGS. 6B, 7B, 8B, 9B, 10B, 11B, 12B, 13B, 14B, 15B, and 16B are cross-sectional views respectively illustrating configurations corresponding to a cross-section taken along the line Y-Y' of FIG. 1A, according to a process order. Moreover.

DETAILED DESCRIPTION

Figure 1A:
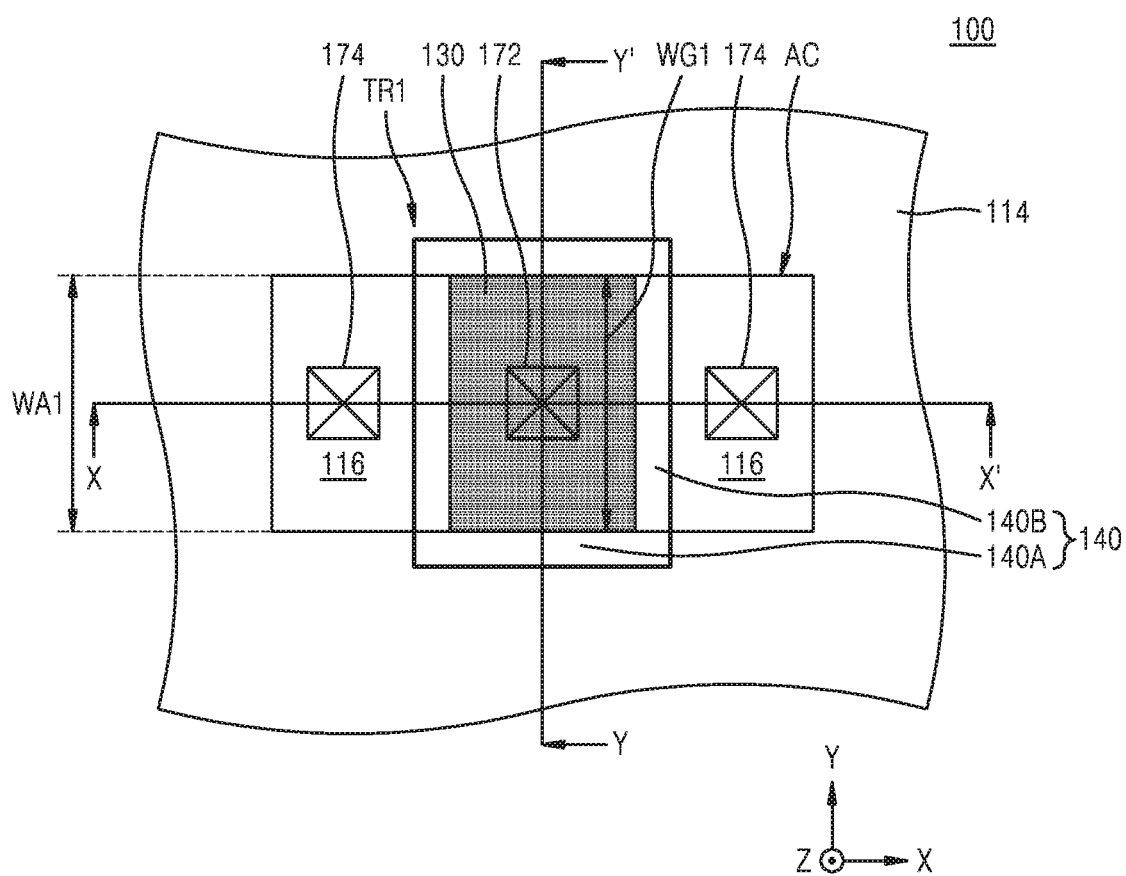
FIG. 1A is a planar layout diagram of main components of an integrated circuit device according to some embodiments of the inventive concepts.

Hereinafter, embodiments of the inventive concepts will be described in detail with reference to the accompanying drawings. Like components will be denoted by like reference numerals throughout the specification, and repeated descriptions thereof may be omitted.

Figure 1B:
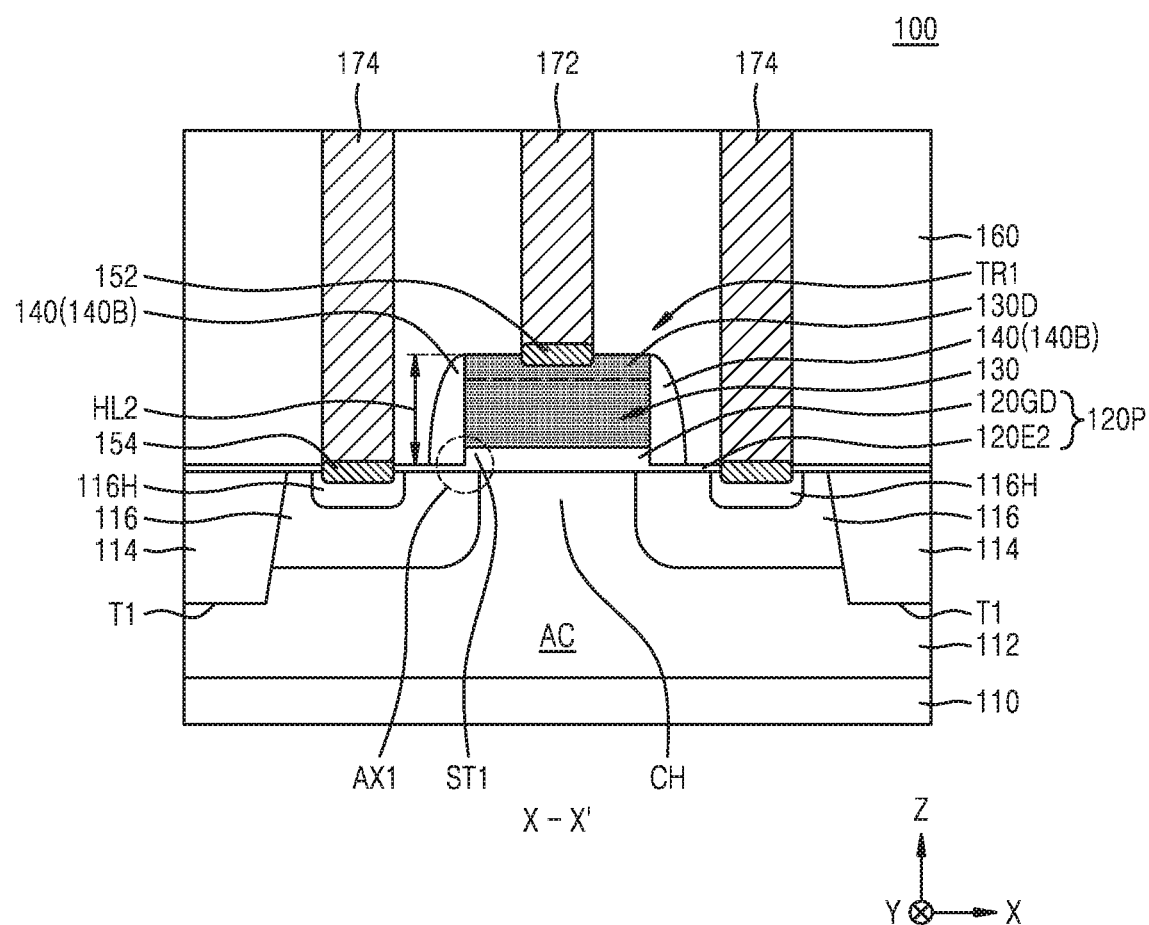
FIG. 1B is a cross-sectional view taken along a line X-X' of FIG. 1A.
Figure 1C:
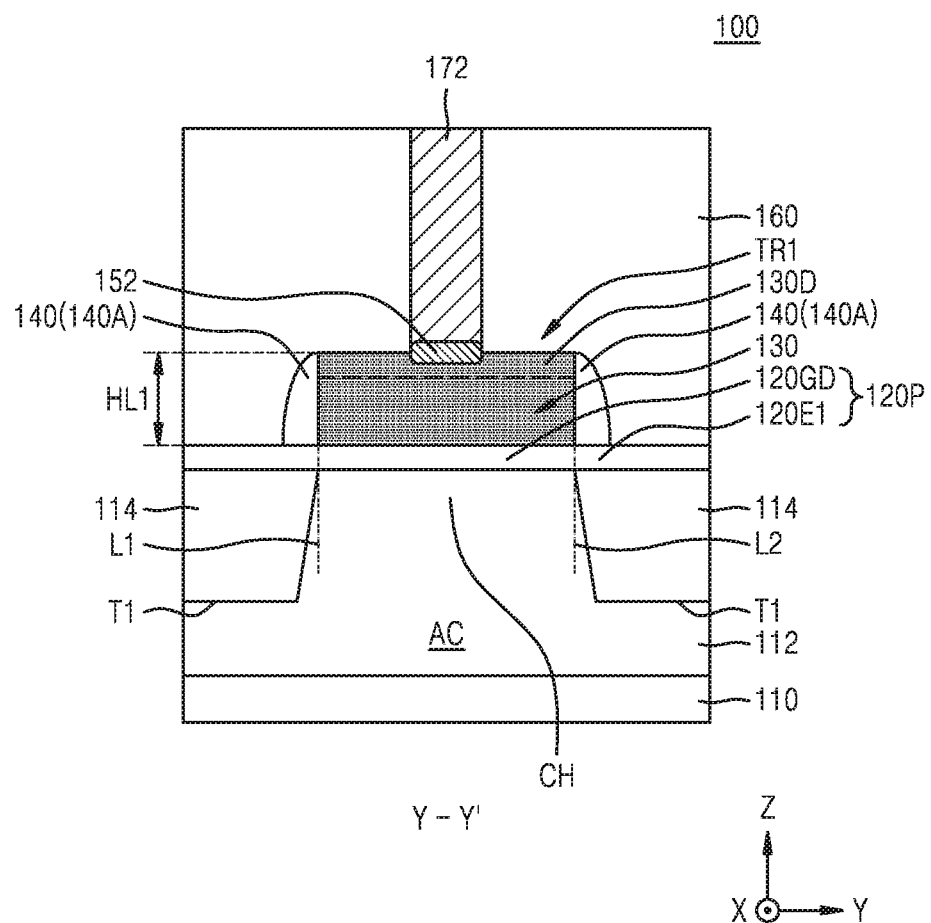
FIG. 1C is a cross-sectional view taken along a line Y-Y' of FIG. 1A.

FIG. 1A is a planar layout diagram of main components of an integrated circuit device according to some embodiments of the inventive concepts, FIG. 1B is a cross-sectional view taken along a line X-X' of FIG. 1A, and FIG. 1C is a cross-sectional view taken along a line Y-Y' of FIG. 1A.

Referring to FIGS. 1A to 1C, an integrated circuit device 100 includes a transistor TR1 formed on a substrate 110 in which a well 112 is formed. The transistor TR1 may be a high-voltage transistor that is configured to operate at a high voltage of about 8 V to about 200 V.

The substrate 110 includes a trench region T1. An active region AC may be defined in the substrate 110 by the trench region T1 and a device isolation film 114 that is in (e.g., that fills) the trench region T1. The active region AC has a first width WA1 in a Y direction (first horizontal direction).

The substrate 110 may include a semiconductor substrate. In some embodiments, the substrate 110 may include a semiconductor such as silicon (Si) or germanium (Ge). In some embodiments, the substrate 110 may include a compound semiconductor such as SiGe, silicon carbide (SiC), gallium arsenide (GaAs), indium arsenide (InAs), or indium phosphide (InP).

A pair of source/drain regions 116 are formed in the active region AC, the pair of source/drain regions 116 being surrounded by the well 112. The well 112 may include an impurity-doped region of a first conductivity type, for example, a p-type. The pair of source/drain regions 116 may include impurity-doped regions of a second conductivity type, for example, an n-type, which is opposite to the first conductivity type. A high-concentration doped region 116H is formed in an upper portion of each of the pair of source/drain regions 116. The pair of source/drain regions 116 and the high-concentration doped region 116H may each be doped to be of the same conductivity type, and an impurity concentration in the high-concentration doped region 116H may be greater than that in each of the pair of source/drain regions 116.

A gate electrode 130 is formed over the active region AC and between the pair of source/drain regions 116. The gate electrode 130 may be arranged to vertically overlap only the active region AC without including a portion vertically overlapping the device isolation film 114. Accordingly, sidewalls of the gate electrode 130 may be referred to herein as "vertically non-overlapping with" the device isolation film 114, as the gate electrode 130 may be confined within a perimeter/boundary of the uppermost surface of the active region AC. In the Y direction (first horizontal direction), a widest/maximum width WG1 of the gate electrode 130 may be equal to or less than the first width WA1 of the active region AC. Although FIGS. 1A to 1C illustrate an example in which the maximum width WG1 of the gate electrode 130 is equal to the first width WA1, the inventive concepts are not limited to the example shown in FIGS. 1A to 1C. For example, in a plan view shown in FIG. 1A, the widest/maximum width WG1 of the gate electrode 130 may be less than the first width WA1 of the active region AC, within a range in which the gate electrode 130 does not depart from (e.g., does not extend beyond) a range (e.g., a perimeter) of the active region AC.

As shown in FIG. 1C, the gate electrode 130 may not extend in the Y direction beyond (e.g., may not cover) a border (e.g., a boundary/interface) between the device isolation film 114 and a top (e.g., topmost/uppermost) surface of the active region AC. Rather, the gate electrode 130 may be confined within a perimeter/boundary of the uppermost surface of the active region AC. In FIG. 1C, opposite sidewalls of the gate electrode 130 may be vertically straightly aligned with a portion (e.g., an uppermost portion) of the border between the device isolation film 114 and the top surface of the active region AC. Thus, in FIG. 1C, each of imaginary vertical extension lines L1 and L2 (e.g., vertical axes) extending from opposite sidewalls of the gate electrode 130 toward the substrate 110 may pass through the border between the device isolation film 114 and the top surface of the active region AC.

In the integrated circuit device 100, in the top surface of the active region AC between the pair of source/drain regions 116, a shortest/minimum horizontal distance from the border between the active region AC and the device isolation film 114 to each of the imaginary vertical extension lines L1 and L2 may be substantially zero (0).

A high-concentration doped region 130D may be formed in an upper portion of the gate electrode 130. The high-concentration doped region 130D may be doped with impurities of the second conductivity type. The high-concentration doped region 130D and the high-concentration doped region 116H may include the same impurity ions, the high-concentration doped region 116H being formed in the upper portion of each of the pair of source/drain regions 116.

The integrated circuit device 100 may include an insulating spacer 140 on (e.g., covering) sidewalls of the gate electrode 130. The insulating spacer 140 may include a first spacer portion 140A, which is arranged over the device isolation film 114 and is on (e.g., covers at least a portion of) a sidewall of the gate electrode 130, as shown in FIG. 1C, and a second spacer portion 140B, which is arranged over the active region AC and is on (e.g., covers at least a portion of) a sidewall of the gate electrode 130, as shown in FIG. 1B. The first spacer portion 140A may be integrally connected to the second spacer portion 140B, as illustrated in FIG. 1A. A first vertical length (e.g., vertical height) HL1 of the first spacer portion 140A may be less than a second vertical length (e.g., vertical height) HL2 of the second spacer portion 140B.

An insulating film pattern 120P may be interposed/intervening between the active region AC and the gate electrode 130. Accordingly, the insulating film pattern 120P may extend parallel to a main/primary (e.g., uppermost) surface of the substrate 110. The insulating film pattern 120P may include a gate insulating portion 120GD, a first extension insulating portion 120E1, and a second extension insulating portion 120E2, which are integrally connected to each other. The gate insulating portion 120GD may be interposed/intervening between a channel region CH of the active region AC and the gate electrode 130, the first extension insulating portion 120E1 may be interposed/intervening between the first spacer portion 140A and the active region AC, and the second extension insulating portion 120E2 may be interposed/intervening between the second spacer portion 140B and the active region AC. The insulating film pattern 120P may include a silicon oxide film, but is not limited thereto.

A thickness of the gate insulating portion 120GD may be substantially equal to a thickness of the first extension insulating portion 120E1. The thickness of the first extension insulating portion 120E1 may be different from a thickness of the second extension insulating portion 120E2. In some embodiments, the thickness of the first extension insulating portion 120E1 may be greater than the thickness of the second extension insulating portion 120E2. Thus, as shown in an area marked by a dashed circle AX1 in FIG. 1B, the insulating film pattern 120P may have a step (e.g., a stepped portion) ST1. The step ST1 may be interposed (e.g., may provide a transition) between the gate insulating portion 120GD and the second extension insulating portion 120E2, the step ST1 being on a vertical extension line (e.g., a vertical axis) of an interface between the second spacer portion 140B and the gate electrode 130.

An interlayer dielectric 160, which overlaps (e.g., covers) each of the device isolation film 114, the gate electrode 130, and the pair of source/drain regions 116, is formed over the substrate 110. A gate contact plug 172 and a plurality of source/drain contact plugs 174 may extend in (e.g., through) the interlayer dielectric 160. The interlayer dielectric 160 may include an oxide film, a nitride film, or combinations thereof. The gate contact plug 172 may be connected to the gate electrode 130 via a first metal silicide film 152 formed on the high-concentration doped region 130D of the gate electrode 130. The plurality of source/drain contact plugs 174 may be respectively connected (e.g., electrically connected) to the pair of source/drain regions 116 via a second metal silicide film 154 formed on the high-concentration doped regions 116H of the source/drain regions 116.

In some embodiments, each of the first metal silicide film 152 and the second metal silicide film 154 may include titanium (Ti) silicide, cobalt (Co) silicide, or nickel (Ni) silicide, but are not limited thereto. In some embodiments, each of the gate contact plug 172 and the plurality of source/drain contact plugs 174 may include a stack structure including a conductive barrier film and a metal plug. The conductive barrier film may include Ti, titanium nitride (TiN), or combinations thereof, and the metal plug may include tungsten (W), without being limited thereto.

Generally, in a high-voltage transistor that operates at a high voltage of about 8 V to about 200 V, when a gate electrode extends horizontally over a top surface of an active region and even over a top surface of a device isolation film defining the active region and thus extends through a vertical axis that passes through an interface between the active region and the device isolation film, since a well doping concentration may be lower, due to dopant segregation, in the vicinity of the interface between the active region and the device isolation film than in other portions, inversion may be prone to occur in the vicinity of the interface even when a lower voltage than a threshold voltage is applied to the gate electrode. As a result, an edge channel may be formed in the vicinity of the interface at a lower voltage than the threshold voltage, and thus may cause a hump phenomenon. When the hump phenomenon occurs, the threshold voltage of the transistor may be reduced due to a parasitic transistor formed at an edge of the gate electrode, and leakage currents may be increased at a lower voltage than the threshold voltage. In particular, a fatal current dispersion fault may be caused in an analog semiconductor device and thus may cause an incorrect operation of the transistor.

However, in the integrated circuit device 100 described with reference to FIGS. 1A to 1C, since the gate electrode 130 does not extend horizontally past a vertical axis that passes, in a vertical direction Z that is perpendicular to horizontal directions X and Y, through the border between the active region AC and the device isolation film 114, a border region between the active region AC and the device isolation film 114 may not be affected by a voltage applied to the gate electrode 130. Therefore, an edge channel is not formed in the border region, and thus, a hump phenomenon may not be caused.

In addition, in the integrated circuit device 100 described with reference to FIGS. 1A to 1C, since the gate electrode 130 is arranged over the active region AC not to vertically overlap the device isolation film 114, the area occupied by one transistor TR1 on the substrate 110 is reduced, whereby a structure advantageous for scale-down of a device may be provided, and the transistor TR1 allowing desired performance to be realized with a small/minimum area within a highly reduced area may be provided. Further, in the fabrication of the integrated circuit device 100, since a layout design may be simplified, and a complicated design rule does not need to be applied, productivity of a process of fabricating the integrated circuit device 100 may be improved.

Figure 2:
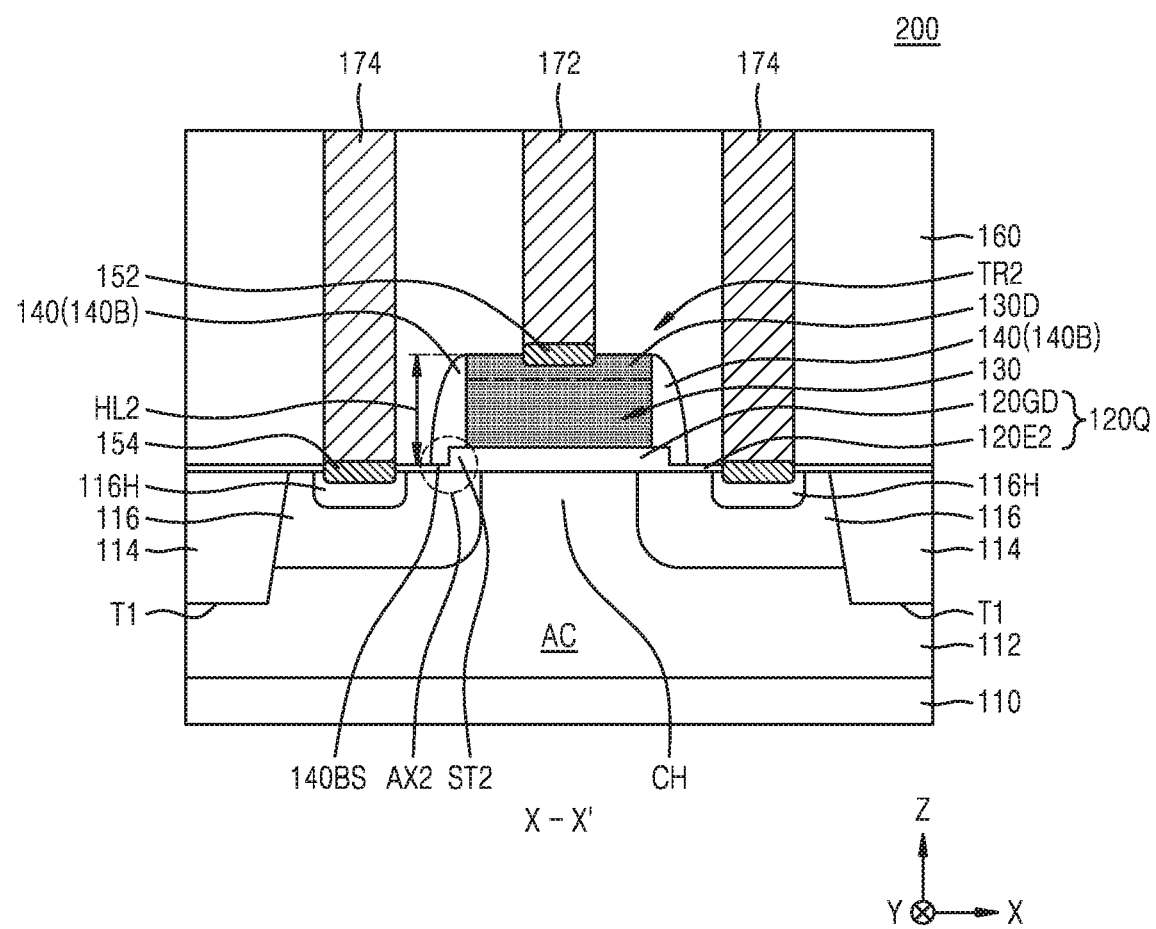
FIG. 2 is a cross-sectional view illustrating an integrated circuit device according to some embodiments of the inventive concepts.

FIG. 2 is a cross-sectional view illustrating an integrated circuit device according to some embodiments of the inventive concepts. FIG. 2 illustrates a modified configuration of a portion corresponding to a cross-section taken along the line X-X' of FIG. 1A. In FIG. 2, the same reference numerals as in FIGS. 1A to 1C respectively denote the same elements/members, and repeated descriptions thereof may be omitted.

Referring to FIG. 2, an integrated circuit device 200 has a similar (or even substantially identical) configuration to the integrated circuit device 100 shown in FIGS. 1A to 1C. However, a transistor TR2 of the integrated circuit device 200 may include an insulating film pattern 120Q between the active region AC and the gate electrode 130. The insulating film pattern 120Q may have a similar (or even substantially identical) configuration to the insulating film pattern 120P described with reference to FIGS. 1A to 1C. However, in the insulating film pattern 120Q, as shown in an area marked by a dashed circle AX2 in FIG. 2, a step ST2 between the gate insulating portion 120GD and the second extension insulating portion 120E2 may be arranged at a position spaced apart from the gate electrode 130. The step ST2 may be located closer to the device isolation film 114 than the interface between the second spacer portion 140B and the gate electrode 130.

The second spacer portion 140B may overlap (e.g., may cover) the step ST2, and may include a bottom surface 140BS on which a step having a shape corresponding to the step ST2 is formed.

According to the integrated circuit device 200 described with reference to FIG. 2, similarly to the integrated circuit device 100 described with reference to FIGS. 1A to 1C, since the gate electrode 130 does not pass through a vertical axis that is aligned in a vertical direction Z (which is perpendicular to the horizontal directions X and Y) with the border between the active region AC and the device isolation film 114, a hump phenomenon due to an edge channel formed in the border region between the active region AC and the device isolation film 114 may be suppressed. In addition, since the gate electrode 130 does not vertically overlap the device isolation film 114, the area occupied by one transistor TR2 on the substrate 110 is reduced, thus providing a structure that may be advantageous for scale-down of a device.

Figure 3A:
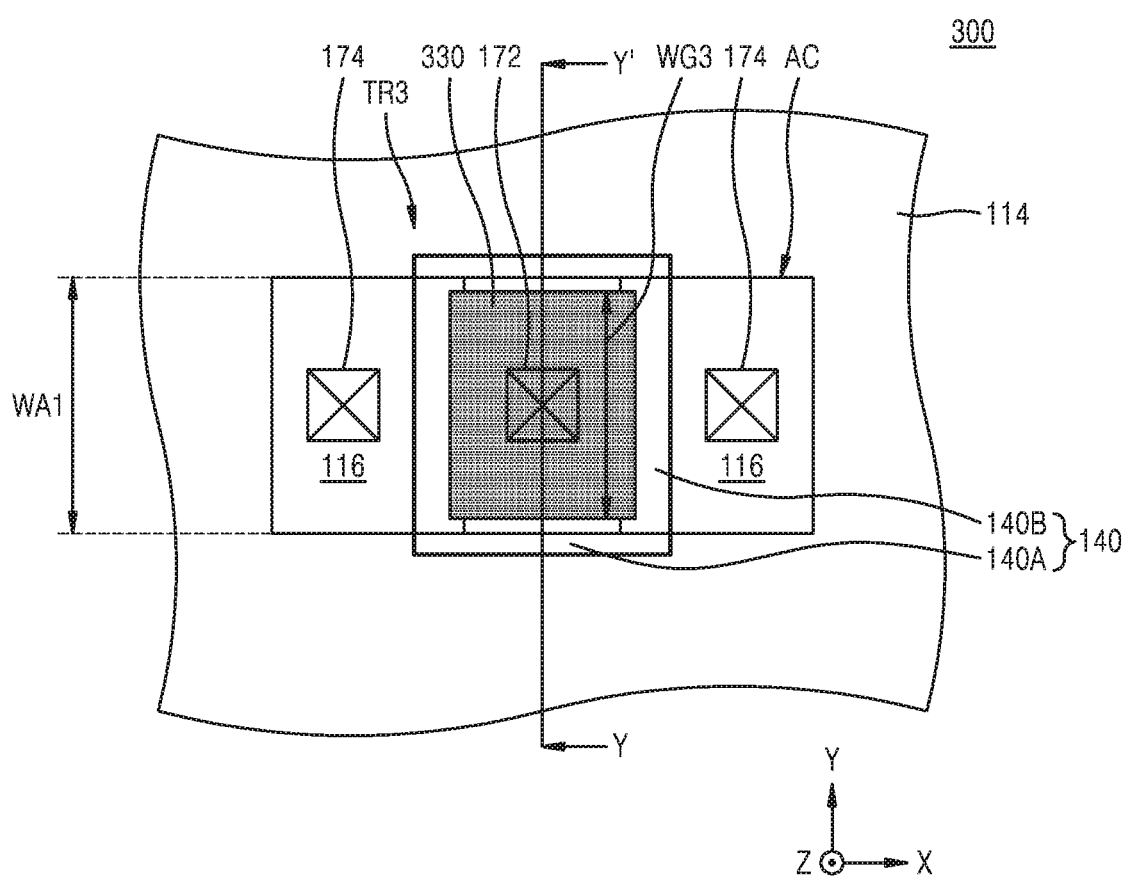
FIG. 3A is a planar layout diagram of main components of an integrated circuit device according to some embodiments of the inventive concepts.
Figure 3B:
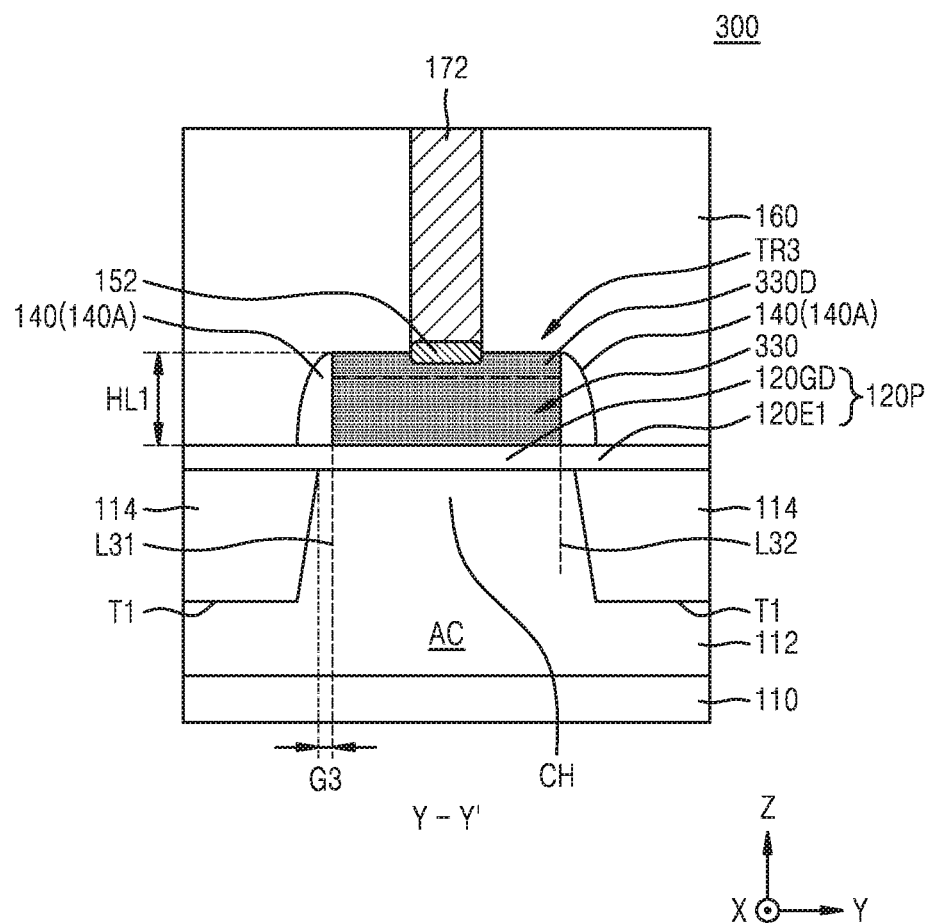
FIG. 3B is a cross-sectional view taken along a line Y-Y' of FIG. 3A.

FIGS. 3A and 3B are diagrams illustrating an integrated circuit device according to some embodiments of the inventive concepts, and in particular, FIG. 3A is a planar layout diagram of main components of an integrated circuit device 300, and FIG. 3B is a cross-sectional view taken along a line Y-Y' of FIG. 3A. In FIGS. 3A and 3B, the same reference numerals as in FIGS. 1A to 1C respectively denote the same elements/members, and repeated descriptions thereof may be omitted.

Referring to FIGS. 3A and 3B, the integrated circuit device 300 has a similar (or even substantially identical) configuration to the integrated circuit device 100 shown in FIGS. 1A to 1C. However, a widest/maximum width WG3 of a gate electrode 330 of a transistor TR3 of the integrated circuit device 300 is less than the first width WA1 of the active region AC, in the Y direction (first horizontal direction). The gate electrode 330 does not overlap/cover the border between the device isolation film 114 and the top surface of the active region AC. In a plan view shown in FIG. 3A, opposite sidewalls of the gate electrode 330, in the Y direction (first horizontal direction), may be spaced apart from the border between the device isolation film 114 and the top surface of the active region AC, and may be located within the perimeter/range of the active region AC.

In the active region AC between the pair of source/drain regions 116, a shortest/minimum horizontal distance G3 from the border between the top surface of the active region AC and the device isolation film 114 to each of imaginary vertical extension lines (e.g., vertical axes) L31 and L32 extending from sidewalls of the gate electrode 330 toward the substrate 110 may be greater than 0. In some embodiments, the shortest/minimum horizontal distance G3 from the border between the top surface of the active region AC and the device isolation film 114 to each of the imaginary vertical extension lines L31 and L32 may be selected from a range that is greater than about 0 and equal to or less than about 0.3 micrometers (μm).

The first spacer portion 140A of the insulating spacer 140 between the pair of source/drain regions 116 may overlap (e.g., may cover) the border between the active region AC and the device isolation film 114.

A high-concentration doped region 330D may be formed in an upper portion of the gate electrode 330. More detailed configurations (e.g., aspects) of the gate electrode 330 and the high-concentration doped region 330D are similar (or even substantially identical) to those described regarding the gate electrode 130 and the high-concentration doped region 130D with reference to FIGS. 1A to 1C.

According to the integrated circuit device 300 described with reference to FIGS. 3A and 3B, since the gate electrode 330 does not pass through a vertical axis that is aligned with the border between the active region AC and the device isolation film 114, a hump phenomenon due to an edge channel formed in the border region between the active region AC and the device isolation film 114 may be suppressed. In addition, since the gate electrode 330 does not vertically overlap the device isolation film 114, the area occupied by one transistor TR3 on the substrate 110 is reduced, thus providing a structure that may be advantageous for scale-down of a device.

Figure 4A:
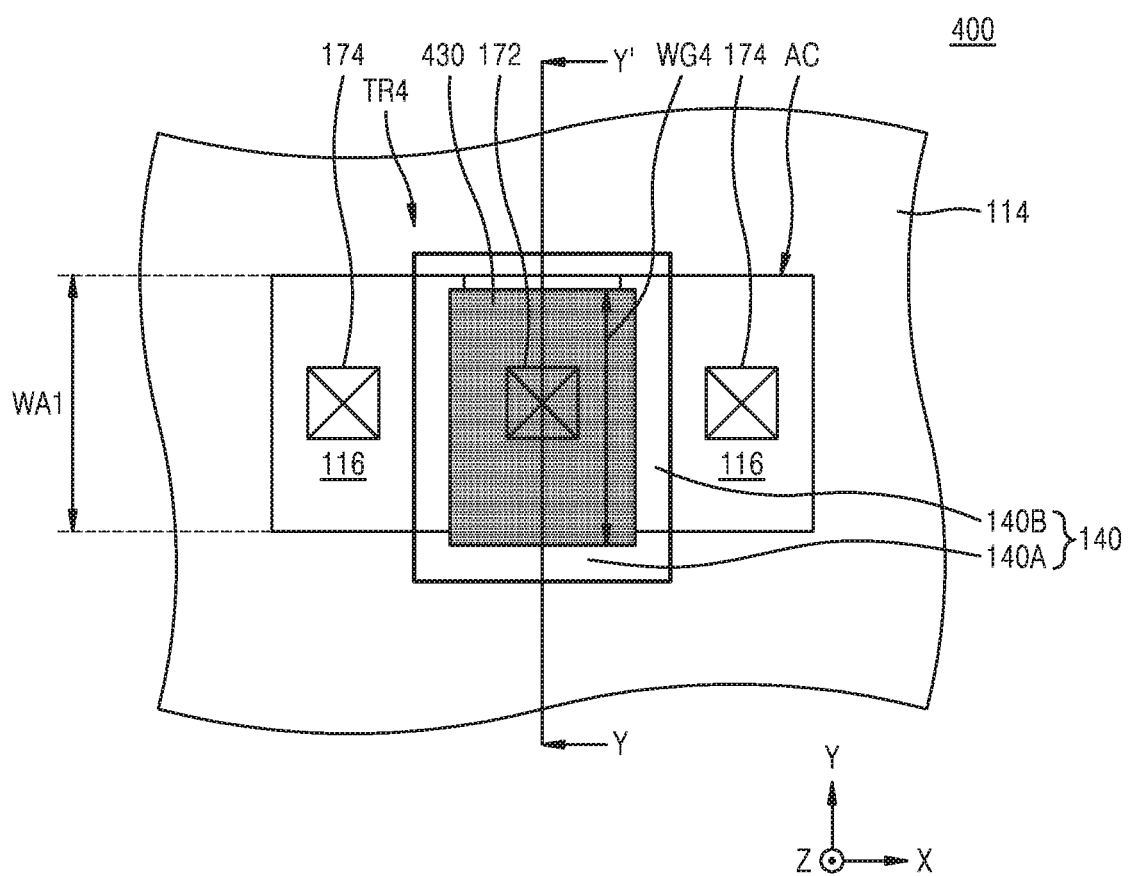
FIG. 4A is a planar layout diagram of main components of an integrated circuit device according to some embodiments of the inventive concepts.
Figure 4B:
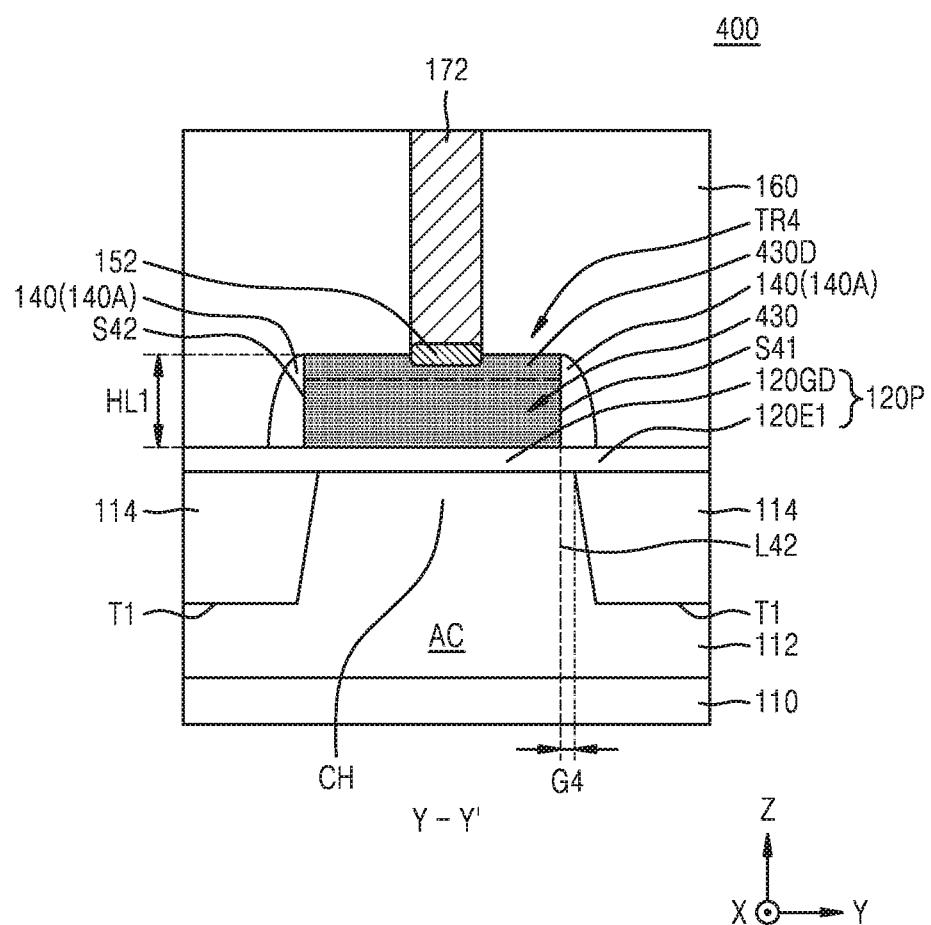
FIG. 4B is a cross-sectional view taken along a line Y-Y' of FIG. 4A.

FIGS. 4A and 4B are diagrams illustrating an integrated circuit device according to some embodiments of the inventive concepts. In particular, FIG. 4A is a planar layout diagram of main components of an integrated circuit device 400, and FIG. 4B is a cross-sectional view taken along a line Y-Y' of FIG. 4A. In FIGS. 4A and 4B, the same reference numerals as in FIGS. 1A to 1C respectively denote the same elements/members, and repeated descriptions thereof may be omitted.

Referring to FIGS. 4A and 4B, the integrated circuit device 400 has a similar (or even substantially identical) configuration to the integrated circuit device 100 shown in FIGS. 1A to 1C. However, a transistor TR4 of the integrated circuit device 400 includes a gate electrode 430. In the Y direction (first horizontal direction), at least a portion of the gate electrode 430 may be arranged to vertically overlap only the active region AC without vertically overlapping the device isolation film 114. In the Y direction (first horizontal direction), a widest/maximum width WG4 of the gate electrode 430 may be equal to or less than the first width WA1 of the active region AC.

In the Y direction (first horizontal direction), one end among opposite ends of the gate electrode 430 may not vertically overlap (e.g., may not cover) the border between the device isolation film 114 and the top surface of the active region AC. Moreover, in the Y direction (first horizontal direction), one sidewall S41 among opposite sidewalls of the gate electrode 430 may be located at a position horizontally spaced apart from the border between the device isolation film 114 and the top surface of the active region AC in a direction away from the device isolation film 114. Therefore, in the Y direction (first horizontal direction), the one sidewall S41 of the gate electrode 430 may be located within the perimeter/range of the active region AC in a plan view. The other end among opposite ends of the gate electrode 430 may vertically overlap (e.g., may cover) the border between the device isolation film 114 and the top surface of the active region AC. Moreover, in the Y direction (first horizontal direction), the other sidewall S42 among opposite sidewalls of the gate electrode 430 may be located at a position horizontally spaced apart from the border between the device isolation film 114 and the top surface of the active region AC in a direction away from the active region AC. Therefore, in the Y direction (first horizontal direction), the other sidewall S42 of the gate electrode 430 may be located over the device isolation film 114 outside the perimeter/range of the active region AC in a plan view.

In the integrated circuit device 400, a shortest/minimum horizontal distance G4 from the border between the top surface of the active region AC and the device isolation film 114 to an imaginary vertical extension line (e.g., a vertical axis) L42 extending from the one sidewall S41 of the gate electrode 430 toward the substrate 110 may be greater than 0, the active region AC being between the pair of source/drain regions 116. In some embodiments, the shortest/minimum horizontal distance G4 from the border between the top surface of the active region AC and the device isolation film 114 to the imaginary vertical extension line L42 may be selected from a range that is greater than about 0 and equal to or less than about 0.3 µm. Moreover, a vertical axis that is parallel to the imaginary vertical extension line L42 and that extends through the border between the top surface of the active region AC and the device isolation film 114 may also extend through the first spacer portion 140A of the insulating spacer 140.

Of the first spacer portion 140A of the insulating spacer 140 between the pair of source/drain regions 116, a portion/region on (e.g., covering) the one sidewall S41 of the gate electrode 430 may vertically overlap (e.g., may cover) the border between the active region AC and the device isolation film 114, and a portion/region on (e.g., covering) the other sidewall S42 of the gate electrode 430 may not vertically overlap (e.g., may not cover) at least an uppermost portion of the border between the active region AC and the device isolation film 114. The portion/region of the first spacer portion 140A that is on (e.g., that covers) the other sidewall S42 of the gate electrode 430 may be arranged over the device isolation film 114 to vertically overlap the device isolation film 114 while not vertically overlapping the top surface of the active region AC.

A high-concentration doped region 430D may be formed in an upper portion of the gate electrode 430. More detailed configurations (e.g., aspects) of the gate electrode 430 and the high-concentration doped region 430D are similar (or even substantially identical) to those described regarding the gate electrode 130 and the high-concentration doped region 130D with reference to FIGS. 1A to 1C.

According to the integrated circuit device 400 described with reference to FIGS. 4A and 4B, since at least a portion of the gate electrode 430 does not pass through a vertical axis that is aligned with the border between the active region AC and the device isolation film 114, a hump phenomenon due to an edge channel formed in the border region between the active region AC and the device isolation film 114 may be suppressed. In addition, since the area in which the gate electrode 430 vertically overlaps the device isolation film 114 may be reduced/minimized, the area occupied by one transistor TR4 on the substrate 110 may be reduced, thus providing a structure that may be advantageous for scale-down of a device.

Figure 5:
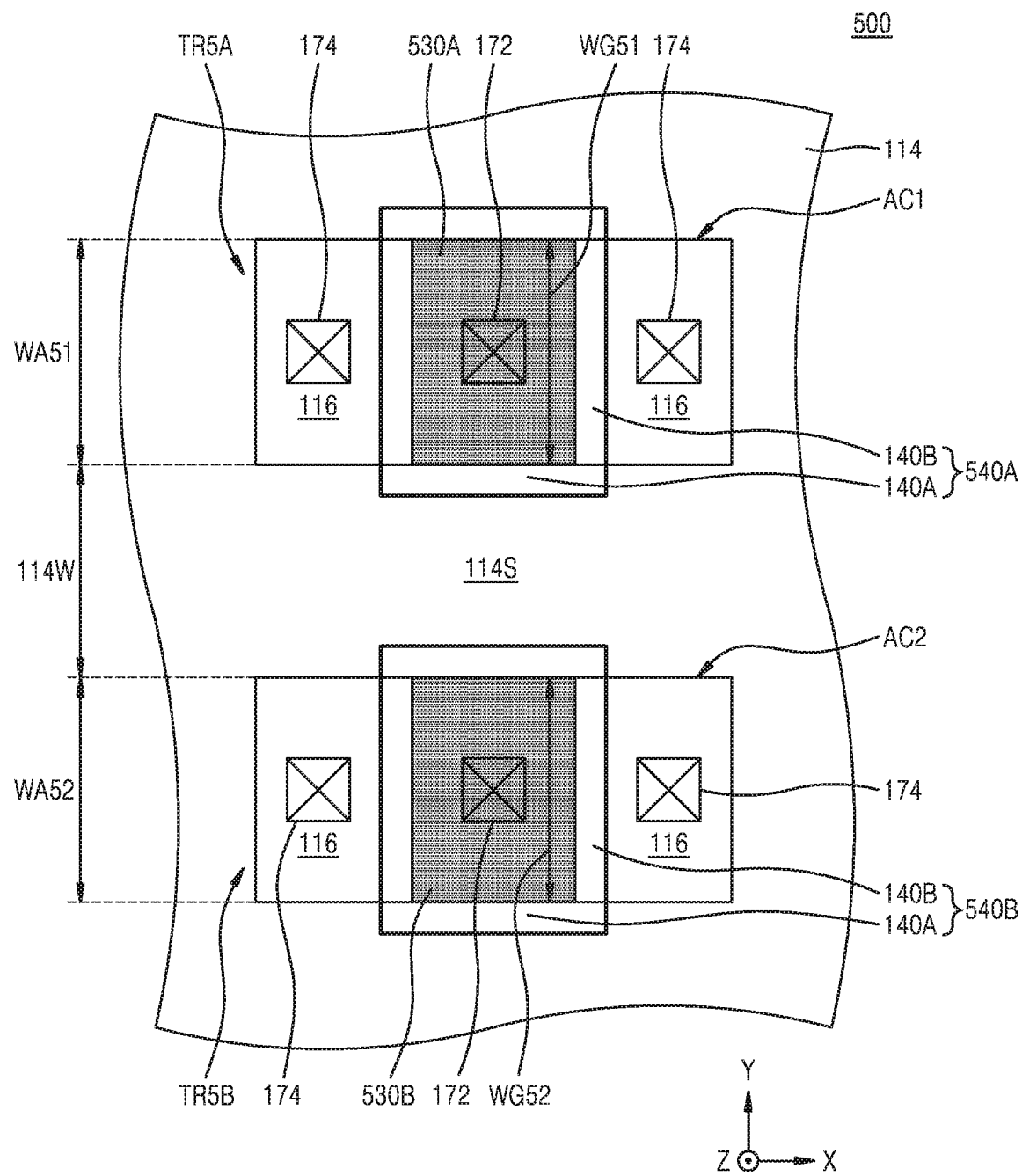
FIG. 5 is a planar layout diagram illustrating an example configuration of an integrated circuit device according to some embodiments of the inventive concepts.

FIG. 5 is a planar layout diagram illustrating an example configuration of an integrated circuit device according to some embodiments of the inventive concepts. In FIG. 5, the same reference numerals as in FIGS. 1A to 1C respectively denote the same elements/members, and repeated descriptions thereof may be omitted.

Referring to FIG. 5, an integrated circuit device 500 includes a first active region AC1 and a second active region AC2, which are defined in the substrate 110. A first transistor TR5A and a second transistor TR5B are respectively formed on the first active region AC1 and the second active region AC2. Each of the first transistor TR5A and the second transistor TR5B may be a high-voltage transistor that operates at a high voltage of about 8 V to about 200 V.

Each of the first transistor TR5A and the second transistor TR5B may have a similar (or even substantially identical) configuration to the transistor TR1 described with reference to FIGS. 1A to 1C.

The first active region AC1 and the second active region AC2 are defined by the device isolation film 114 formed on the substrate 110, and are spaced apart from each other in the Y direction (first horizontal direction), with an isolation region 114S of the device isolation film 114 therebetween.

The first active region AC1 and the second active region AC2 may be formed to extend side by side in an X direction (second horizontal direction) that intersects (e.g., is perpendicular to) the Y direction (first horizontal direction). A width 114W of the isolation region 114S of the device isolation film 114 in the Y direction (first horizontal direction) may be constant (i.e., uniform) between the first active region AC1 and the second active region AC2 along the X direction (second horizontal direction).

A first gate electrode 530A is formed over the first active region AC1, and a second gate electrode 530B is formed over the second active region AC2. Each of the first gate electrode 530A and the second gate electrode 530B may have a similar (or even substantially identical) configuration to the gate electrode 130 described with reference to FIGS. 1A to 1C. The first gate electrode 530A may be located over the first active region AC1 not to vertically overlap (e.g., not to cover) a border between the first active region AC1 and the device isolation film 114. The second gate electrode 530B may be located over the second active region AC2 not to vertically overlap (e.g., not to cover) a border between the second active region AC2 and the device isolation film 114. Each of the first gate electrode 530A and the second gate electrode 530B may not include a portion vertically overlapping the isolation region 114S.

In the Y direction (first horizontal direction), widest/maximum widths WG51 and WG52 of the first gate electrode 530A and the second gate electrode 530B may be equal to or less than widths WA51 and WA52 of the first active region AC1 and the second active region AC2, respectively.

In the Y direction (first horizontal direction), a shortest/minimum distance between the first gate electrode 530A and the second gate electrode 530B may be equal to or greater than a width 114W of the isolation region 114S of the device isolation film 114 in the Y direction (first horizontal direction).

The first transistor TR5A may include a first insulating spacer 540A on (e.g., covering) sidewalls of the first gate electrode 530A. The second transistor TR5B may include a second insulating spacer 540B on (e.g., covering) sidewalls of the second gate electrode 530B. Each of the first insulating spacer 540A and the second insulating spacer 540B may have a similar (or even identical) configuration to the insulating spacer 140 described with reference to FIGS. 1A to 1C.

The first insulating spacer 540A may include a portion vertically overlapping (e.g., covering) the border between the first active region AC1 and the device isolation film 114, a portion vertically overlapping (e.g., covering) the device isolation film 114, and a portion vertically overlapping (e.g., covering) impurity diffusion regions that constitute the pair of source/drain regions 116 of the first transistor TR5A. The second insulating spacer 540B may include a portion vertically overlapping (e.g., covering) the border between the second active region AC2 and the device isolation film 114, a portion vertically overlapping (e.g., covering) the device isolation film 114, and a portion vertically overlapping (e.g., covering) impurity diffusion regions that constitute the pair of source/drain regions 116 of the second transistor TR5B.

Similarly to the insulating spacer 140 described with reference to FIGS. 1A to 1C, a vertical length (Z-directional length) of each of the first insulating spacer 540A and the second insulating spacer 540B over the isolation region 114S of the device isolation film 114 may be different from a vertical length (Z-directional length) thereof over the impurity diffusion regions that constitute the pair of source/drain regions 116.

Similarly to the transistor TR1 described with reference to FIGS. 1A to 1C, each of the first transistor TR5A and the second transistor TR5B may include the insulating film pattern 120P (see FIGS. 1B and 1C). A thickness of the insulating film pattern 120P over the isolation region 114S of the device isolation film 114 may be different from a thickness thereof over the impurity diffusion regions that constitute the pair of source/drain regions 116. For example, the thickness of the insulating film pattern 120P over the isolation region 114S of the device isolation film 114 may be greater than the thickness thereof over the impurity diffusion regions that constitute the pair of source/drain regions 116.

According to the integrated circuit device 500 shown in FIG. 5, since the first gate electrode 530A and the second gate electrode 530B respectively included in the first transistor TR5A and the second transistor TR5B adjacent to each other do not extend over the isolation region 114S of the device isolation film 114, a separation distance between the first gate electrode 530A and the second active region AC2, and a separation distance between the second gate electrode 530B and the first active region AC1 may be sufficiently secured. Therefore, problems, such as adverse effects on electrical properties of the second transistor TR5B due to leakage currents from the first gate electrode 530A, or adverse effects on electrical properties of the first transistor TR5A due to leakage currents from second gate electrode 530B, may be effectively inhibited/prevented.

Although an example in which each of the first transistor TR5A and the second transistor TR5B has a similar (or even identical) structure to the transistor TR1 of the integrated circuit device 100 described with reference to FIGS. 1A to 1C has been described to give an explanation of the integrated circuit device 500 shown in FIG. 5, the inventive concepts are not limited to the example shown in FIG. 5. For example, each of the first transistor TR5A and the second transistor TR5B of the integrated circuit device 500 shown in FIG. 5 may have one structure which is selected from among structures of the transistors TR1, TR2, TR3, and TR4 of the integrated circuit devices 100, 200, 300, and 400 shown in FIGS. 1A to 4B, and/or variously modified and changed structures therefrom, without departing from the spirit and scope of the inventive concepts.

FIGS. 6A to 16B are cross-sectional views illustrating operations (e.g., sequential processes) of a method of fabricating an integrated circuit device, according to some embodiments of the inventive concepts. In particular, among FIGS. 6A to 16B, FIGS. 6A, 7A, 8A, 9A, 10A, 11A, 12A, 13A, 14A, 15A, and 16A are cross-sectional views respectively illustrating configurations corresponding to a cross-section taken along the line X-X' of FIG. 1A, according to a process order. FIGS. 6B, 7B, 8B, 9B, 10B, 11B, 12B, 13B, 14B, 15B, and 16B are cross-sectional views respectively illustrating configurations corresponding to a cross-section taken along the line Y-Y' of FIG. 1A, according to a process order. Moreover, FIG. 7C is a plan view illustrating a planar structure of some components shown in FIGS. 7A and 7B, and FIG. 10C is a plan view illustrating a planar structure of some components shown in FIGS. 10A and 10B. An example method of fabricating the integrated circuit device 100 shown in FIGS. 1A to 1C will be described with reference to FIGS. 6A to 16B. In FIGS. 6A to 16B, the same reference numerals as in FIGS. 1A to 1C respectively denote the same elements/members, and repeated descriptions thereof may be omitted.

Figure 6A:
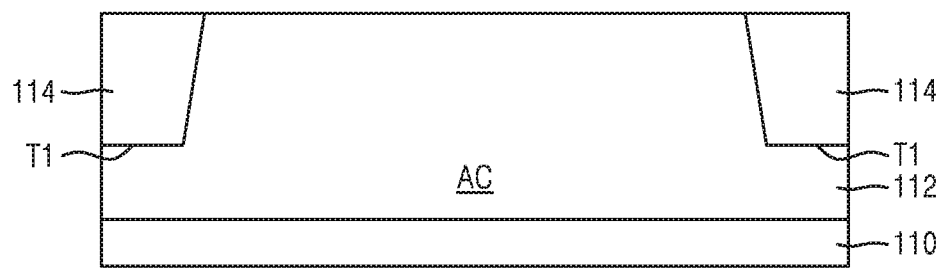
FIGS. 6A, 6B, 7A, 7B, 8A, 8B, 9A, 9B, 10A, 10B, 11A, 11B, 12A, 12B, 13A, 13B, 14A, 14B, 15A, 15B, 16A, and 16B are cross-sectional views illustrating operations (e.g., sequential processes) of a method of fabricating an integrated circuit device, according to some embodiments of the inventive concepts. In particular.
Figure 6A:
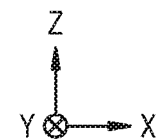
Figure 6B:
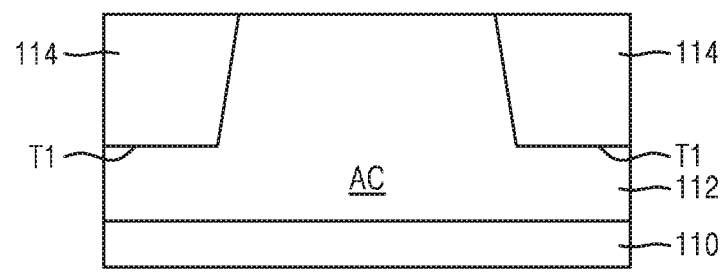
Figure 6B:
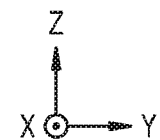
Figure 7A:
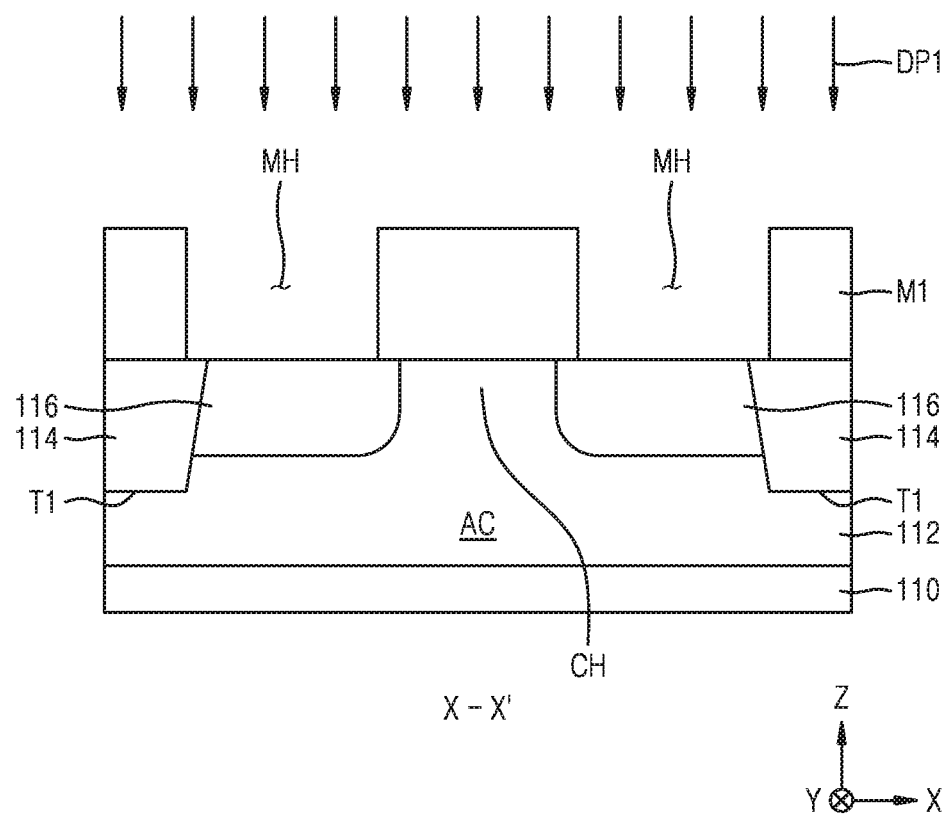
Figure 7B:
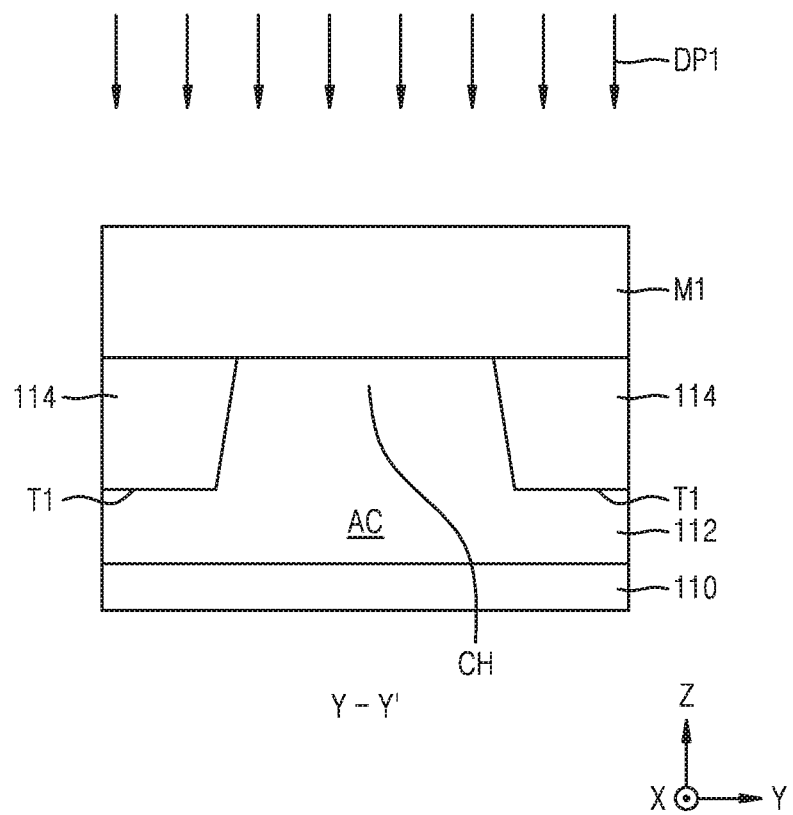
Figure 7C:
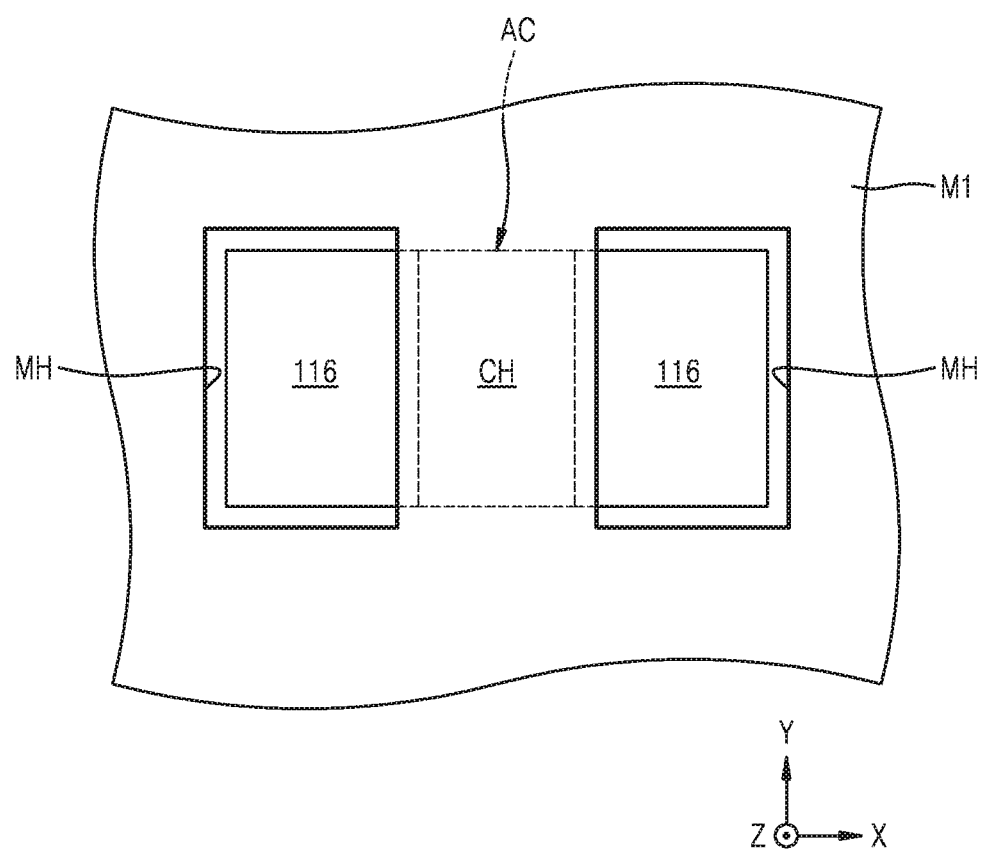
FIG. 7C is a plan view illustrating a planar structure of some components shown in FIGS. 7A and 7B.

Referring to FIGS. 6A and 6B, the substrate 110 is doped with impurity ions, thereby forming the well 112 having the first conductivity type. In some embodiments, when the first conductivity type is a p-type, boron (B) ions may be implanted into the substrate 110 to form the well 112, but the present inventive concepts are not limited thereto.

Next, the trench region T1 is formed in the substrate 110 by partially etching the substrate 110, and the device isolation film 114 is formed in (e.g., to fill) the trench region T1. The active region AC may be defined in the substrate 110 by the trench region T1 and the device isolation film 114.

In some embodiments, to form the trench region T1 in the substrate 110, a hardmask pattern may be formed on the substrate 110, and the substrate 110 may be etched by using the hardmask pattern as an etch mask. The hardmask pattern may have a structure in which an oxide film and a nitride film are stacked in this stated order. The device isolation film 114 may include a silicon oxide film. To form the device isolation film 114, a chemical vapor deposition (CVD) process may be used.

Referring to FIGS. 7A and 7B, a mask pattern M1 is formed on the substrate 110, the mask pattern M1 having a pair of openings MH which expose portions of the active region AC. Next, impurity ions DP1 of the second conductivity type, which is opposite to the first conductivity type, are implanted, by using the mask pattern M1 as an ion implantation mask, into portions of the active region AC that are exposed by the pair of openings MH, thereby forming the pair of source/drain regions 116 in the well 112, the pair of source/drain regions 116 having the second conductivity type.

In some embodiments, the impurity ions DP1 may include phosphorus (P) ions. In the active region AC, a region between the pair of source/drain regions 116 may be the channel region CH.

FIG. 7C is a plan view illustrating a planar structure of the mask pattern M1 in more detail. In FIG. 7C, a planar structure of some components shown in FIGS. 7A and 7B is illustrated. For better understanding, a portion of the active region AC that is vertically overlapped (e.g., covered) with the mask pattern M1 is marked by a dashed line.

Referring to FIGS. 7A to 7C, the pair of openings MH formed in the mask pattern M1 may be spaced apart from each other in the X direction (second horizontal direction) with the channel region CH of the active region AC therebetween.

Figure 8A:
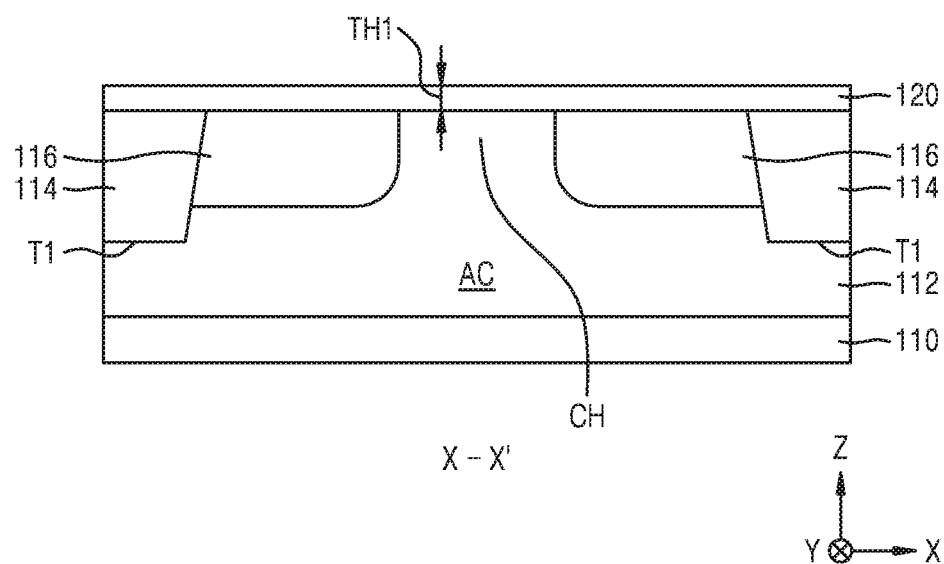
Figure 8B:
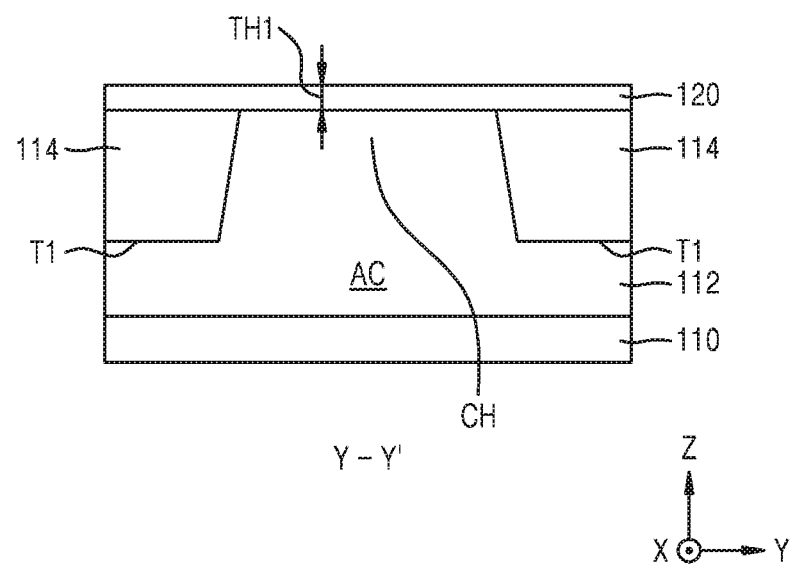

Referring to FIGS. 8A and 8B, the mask pattern M1 is removed from a resultant product/structure of FIGS. 7A and 7B, in which the pair of source/drain regions 116 are formed, followed by forming an insulating film 120, which overlaps (e.g., covers) the active region AC and the device isolation film 114.

In some embodiments, the insulating film 120 may include a silicon oxide film. To form the insulating film 120, a CVD process, or a combination of a thermal oxidation process and a CVD process, may be used.

In some embodiments, a thickness TH1 of the insulating film 120 on the channel region CH may be about 400 Angstroms (Å) to about 500 Å, but is not limited thereto. In some embodiments, the insulating film 120 may be formed to a uniform thickness on the substrate 110.

Figure 9A:
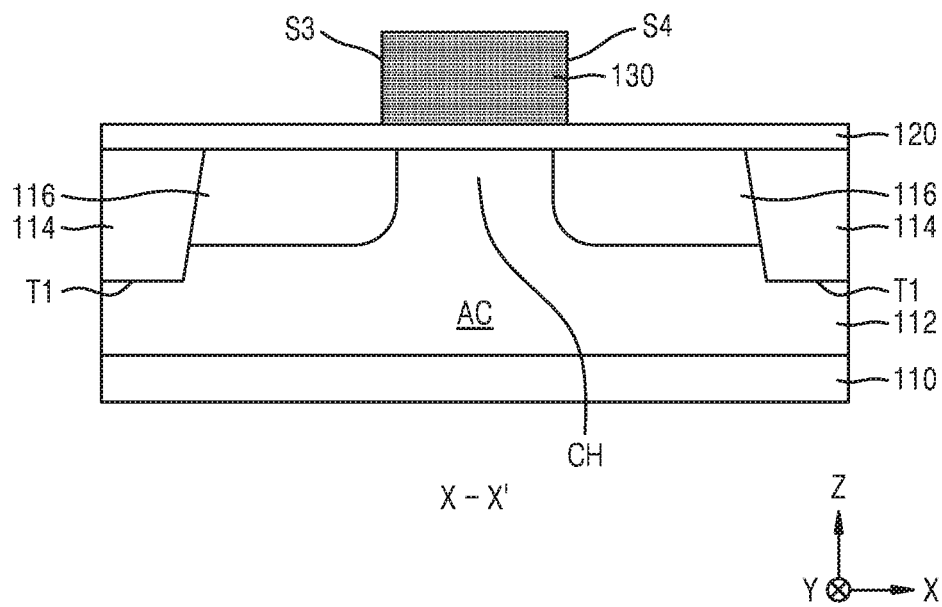
Figure 9B:
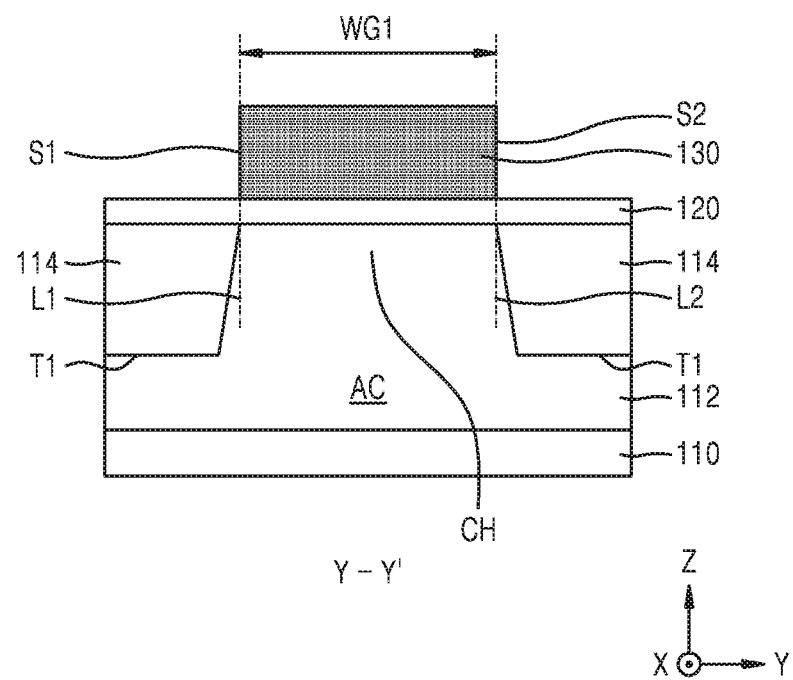

Referring to FIGS. 9A and 9B, the gate electrode 130 is formed on the insulating film 120, the gate electrode 130 vertically overlapping (e.g., covering) the channel region CH.

In the Y direction (first horizontal direction), the widest/maximum width WG1 of the gate electrode 130 may be equal to or less than the first width WA1 (see FIG. 1A) of the active region AC defined by the device isolation film 114. The gate electrode 130 may not include a portion vertically overlapping the device isolation film 114. The gate electrode 130 may be formed to vertically overlap only the active region AC.

The sidewalls of the gate electrode 130 may include a pair of first sidewalls S1 and S2 and a pair of second sidewalls S3 and S4. The pair of first sidewalls S1 and S2 may be arranged over an interface of the device isolation film 114 and the active region AC, at opposite ends of the gate electrode 130 in the Y direction (first horizontal direction). The pair of second sidewalls S3 and S4 may be arranged over the active region AC, at opposite ends of the gate electrode 130 in the X direction (second horizontal direction).

As shown in FIG. 9B, each of the imaginary vertical extension lines (e.g., vertical axes) L1 and L2 extending from the pair of first sidewalls S1 and S2 of the gate electrode 130 toward the substrate 110 may pass through the border between the device isolation film 114 and the top surface of the active region AC. That is, each of the pair of first sidewalls S1 and S2 may be vertically straightly aligned with the border between the device isolation film 114 and the top surface of the active region AC.

To form the gate electrode 130, a conductive layer is formed on an entire surface of a resultant product/structure of FIGS. 8A and 8B, in which the insulating film 120 is formed, followed by patterning the conductive layer by a photolithography process, thereby leaving the gate electrode 130 on the insulating film 120. In some embodiments, the gate electrode 130 may include doped polysilicon.

Figure 10A:
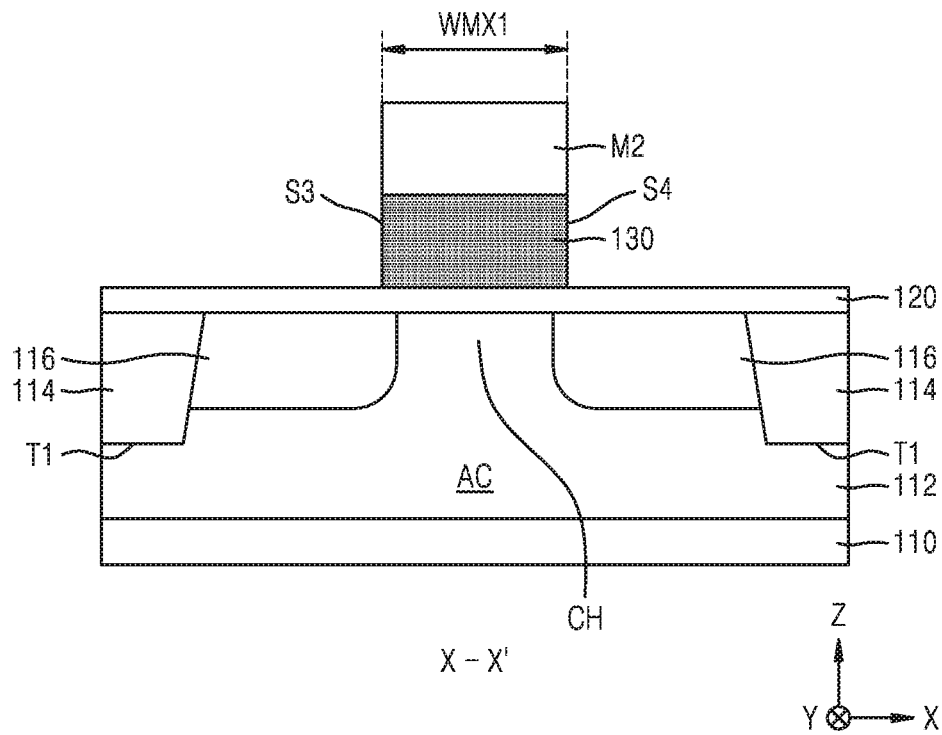
Figure 10B:
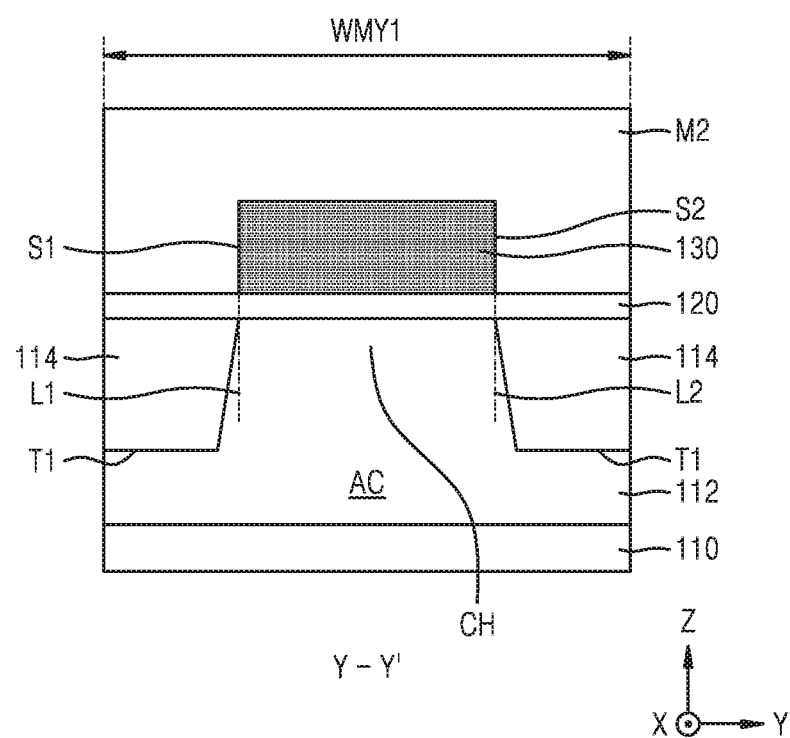
Figure 10C:
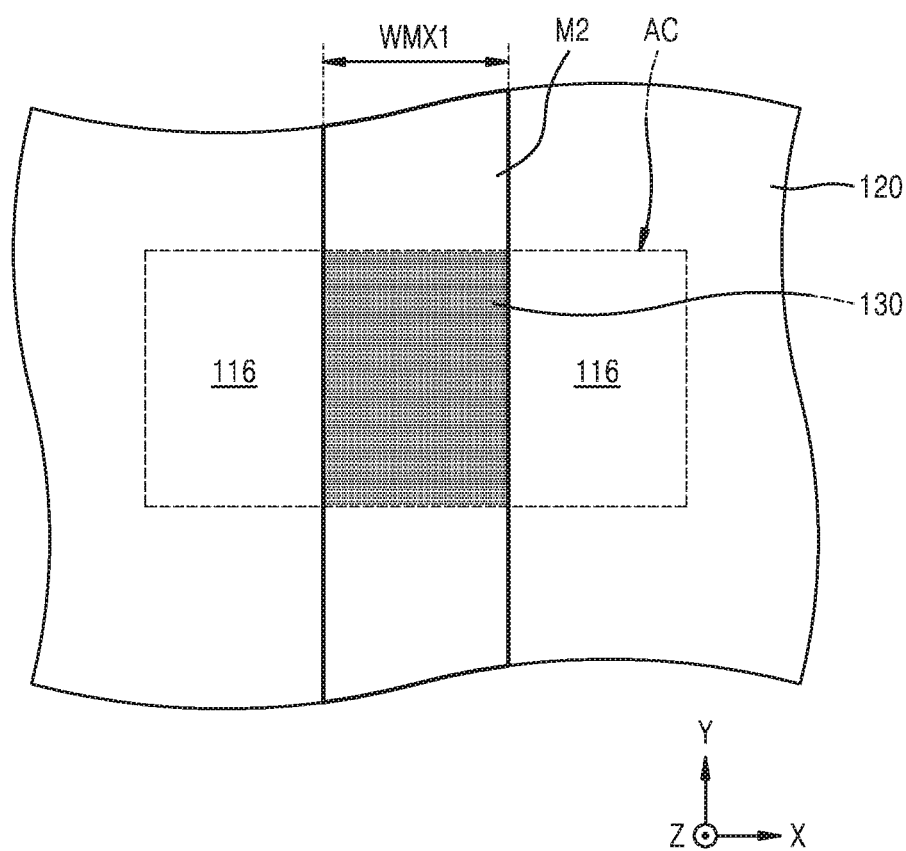
FIG. 10C is a plan view illustrating a planar structure of some components shown in FIGS. 10A and 10B.

Referring to FIGS. 10A and 10B, a mask pattern M2 is formed, the mask pattern M2 overlapping (e.g., covering) the gate electrode 130 and a portion of the insulating film 120 that is exposed around the gate electrode 130.

FIG. 10C is a plan view illustrating, in more detail, a process of forming the mask pattern M2 described with reference to FIGS. 10A and 10B. In FIG. 10C, a planar structure of some components shown in FIGS. 10A and 10B is illustrated. In FIG. 10C, for better understanding, the pair of source/drain regions 116 overlapped (e.g., covered) with the insulating film 120, and the gate electrode 130 overlapped (e.g., covered) with the mask pattern M2 are marked by dashed lines.

Referring to FIGS. 10A to 10C, in the X direction (second horizontal direction), a width WMX1 of the mask pattern M2 may be substantially equal to a width of the gate electrode 130. In the Y direction (first horizontal direction), the mask pattern M2 may have a width WMY1 sufficient to overlap/be on (e.g., cover) a top surface of the gate electrode 130, the pair of first sidewalls S1 and S2 of the gate electrode 130, and the insulating film 120 that is exposed around the pair of first sidewalls S1 and S2. In the Y direction (first horizontal direction), the width WMY1 of the mask pattern M2 may be greater than the width of the gate electrode 130. In the X direction (second horizontal direction), the mask pattern M2 may not be on (e.g., may not cover) the pair of second sidewalls S3 and S4 of the gate electrode 130, despite being on (e.g., covering) the top surface of the gate electrode 130. In some embodiments, the mask pattern M2 may include a photoresist pattern, but is not limited thereto.

Figure 11A:
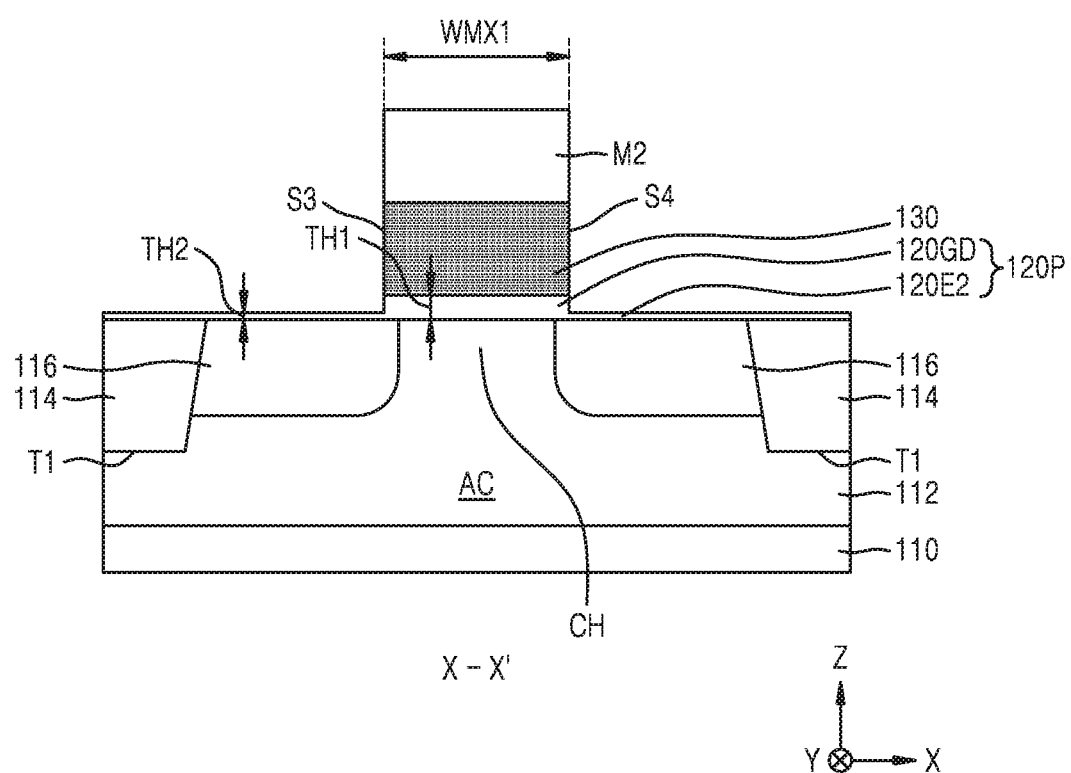
Figure 11B:
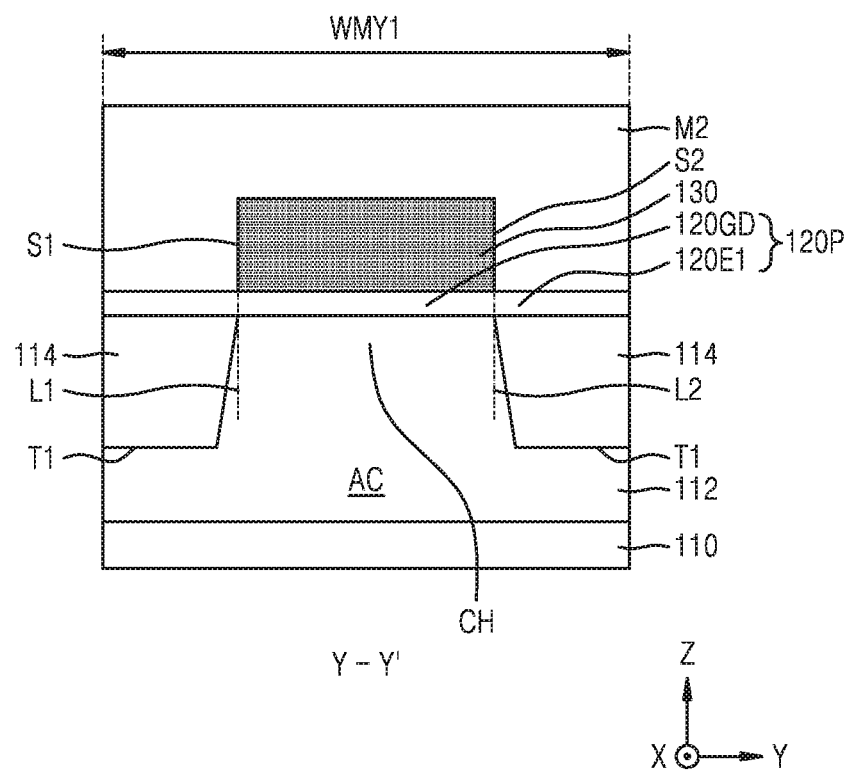

Referring to FIGS. 11A and 11B, the insulating film 120 exposed around the mask pattern M2 is etched as much as a predetermined/certain thickness by using the mask pattern M2 as an etch mask, thereby forming the insulating film pattern 120P, in which portions of the insulating film 120 are reduced in height, the portions overlapping (e.g., covering) the pair of source/drain regions 116.

A portion of the insulating film 120 that is located between the channel region CH of the active region AC and the gate electrode 130 may remain as the gate insulating portion 120GD that maintains the initial thickness TH1 of the insulating film 120 shown in FIGS. 8A and 8B. Portions of the insulating film 120 that vertically overlap (e.g., cover) the device isolation film 114 adjacent to the pair of first sidewalls S1 and S2 of the gate electrode 130, that is, portions of the insulating film 120 that are located on an extension line of (e.g., that protrude beyond) the gate electrode 130 in the Y direction (first horizontal direction), may remain as the first extension insulating portion 120E1 that also maintains the initial thickness TH1 of the insulating film 120 similarly to the gate insulating portion 120GD. In addition, the portions of the insulating film 120 that vertically overlap (e.g., cover) the pair of source/drain regions 116 may remain as the second extension insulating portion 120E2 having a thickness TH2 that is less than the initial thickness TH1 of the insulating film 120.

The gate insulating portion 120GD, the first extension insulating portion 120E1, and the second extension insulating portion 120E2, which constitute the insulating film pattern 120P, may be integrally connected to each other, and the gate insulating portion 120GD may have a substantially equal thickness to the first extension insulating portion 120E1. The thickness of the first extension insulating portion 120E1 may be about 4 times to about 10 times the thickness of the second extension insulating portion 120E2. In some embodiments, the second extension insulating portion 120E2 may have a thickness of about 50 Å to about 100 Å. For example, the second extension insulating portion 120E2 may have a thickness of about 80 Å.

Figure 12A:
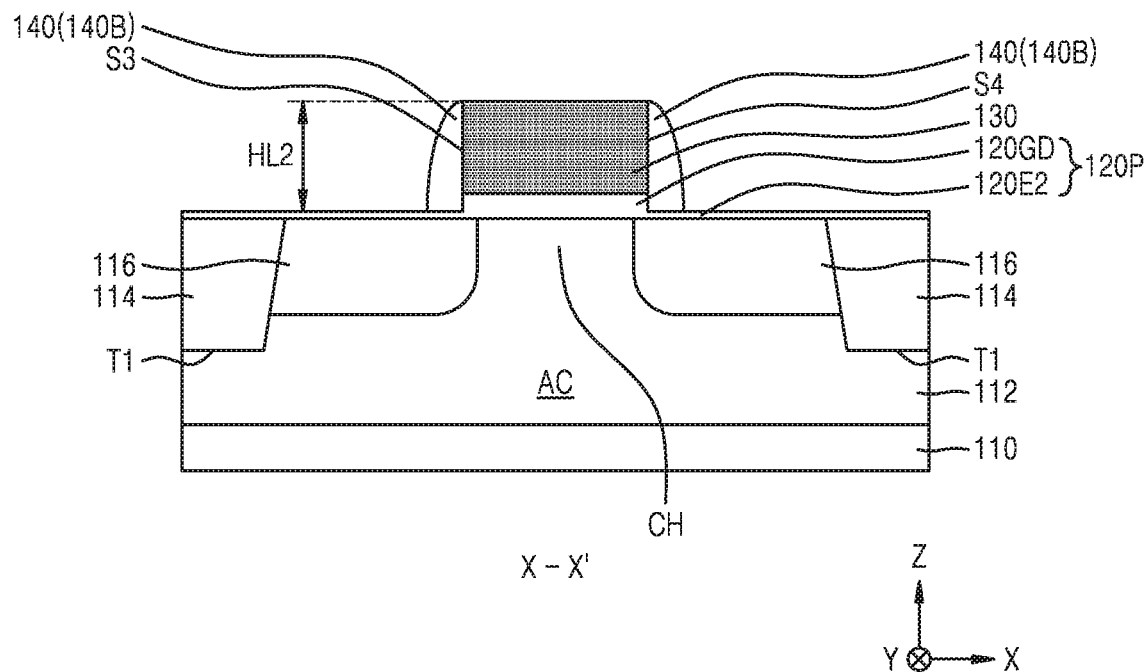
Figure 12B:
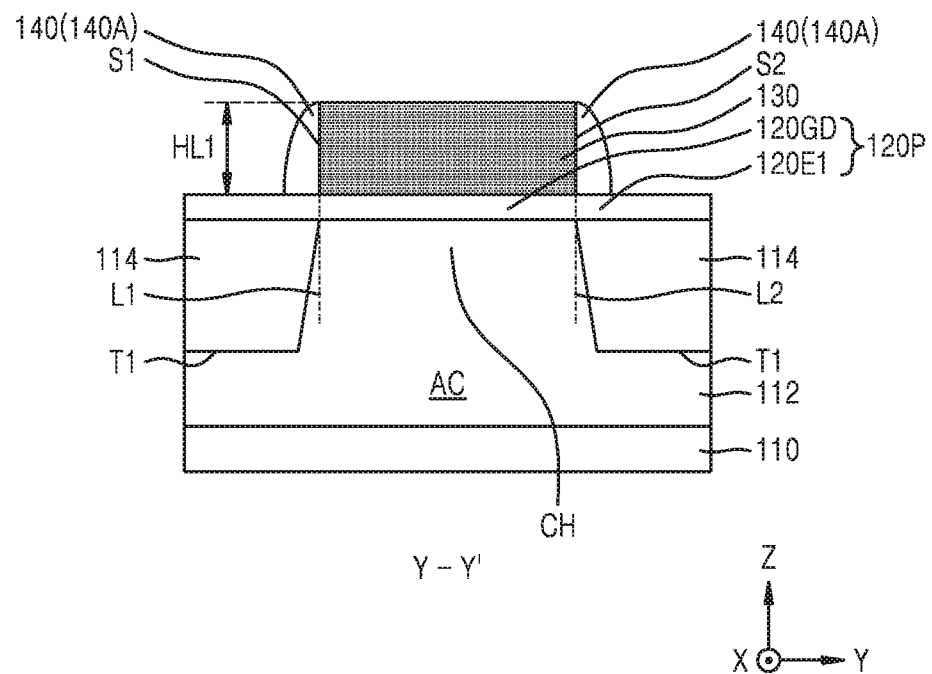

Referring to FIGS. 12A and 12B, the mask pattern M2 is removed from a resultant product/structure of FIGS. 11A and 11B, followed by forming the insulating spacer 140, which is on (e.g., which covers) the sidewalls of the gate electrode 130.

The insulating spacer 140 may have a rectangular/ring shape surrounding the gate electrode 130, as shown in FIG. 1A. The insulating spacer 140 may include the first spacer portion 140A and the second spacer portion 140B, the first spacer portion 140A being arranged over the device isolation film 114 and on (e.g., covering) the pair of first sidewalls S1 and S2 among the sidewalls of the gate electrode 130, and the second spacer portion 140B being arranged over the active region AC and on (e.g., covering) the pair of second sidewalls S3 and S4 among the sidewalls of the gate electrode 130.

The first spacer portion 140A is integrally connected to the second spacer portion 140B, and the first vertical length HL1 of the first spacer portion 140A is less than the second vertical length HL2 of the second spacer portion 140B.

In some embodiments, an imaginary vertical extension line (e.g., vertical axis) L1 extending from an interface between the first spacer portion 140A and the gate electrode 130 toward the substrate 110 may pass through a portion of the top surface of the active region AC contacting the device isolation film 114.

Figure 13A:
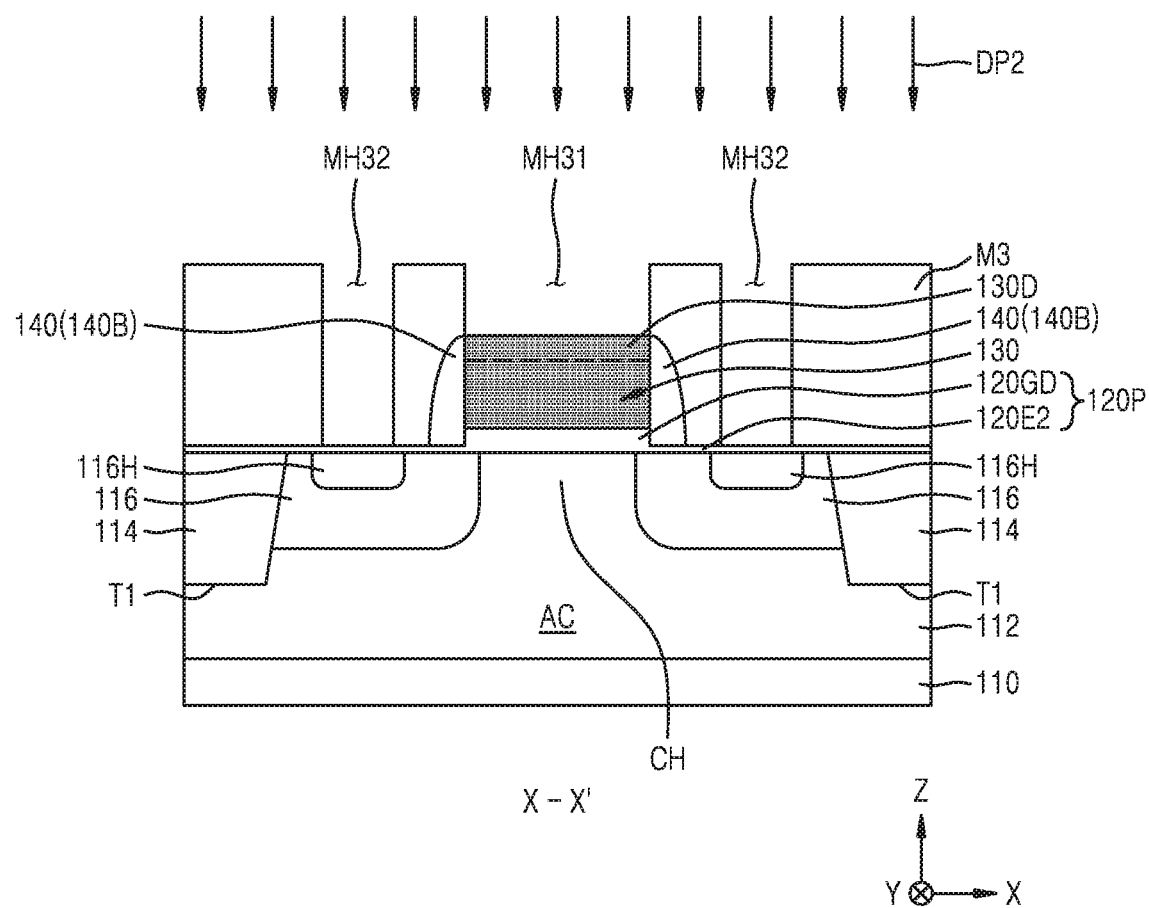
Figure 13B:
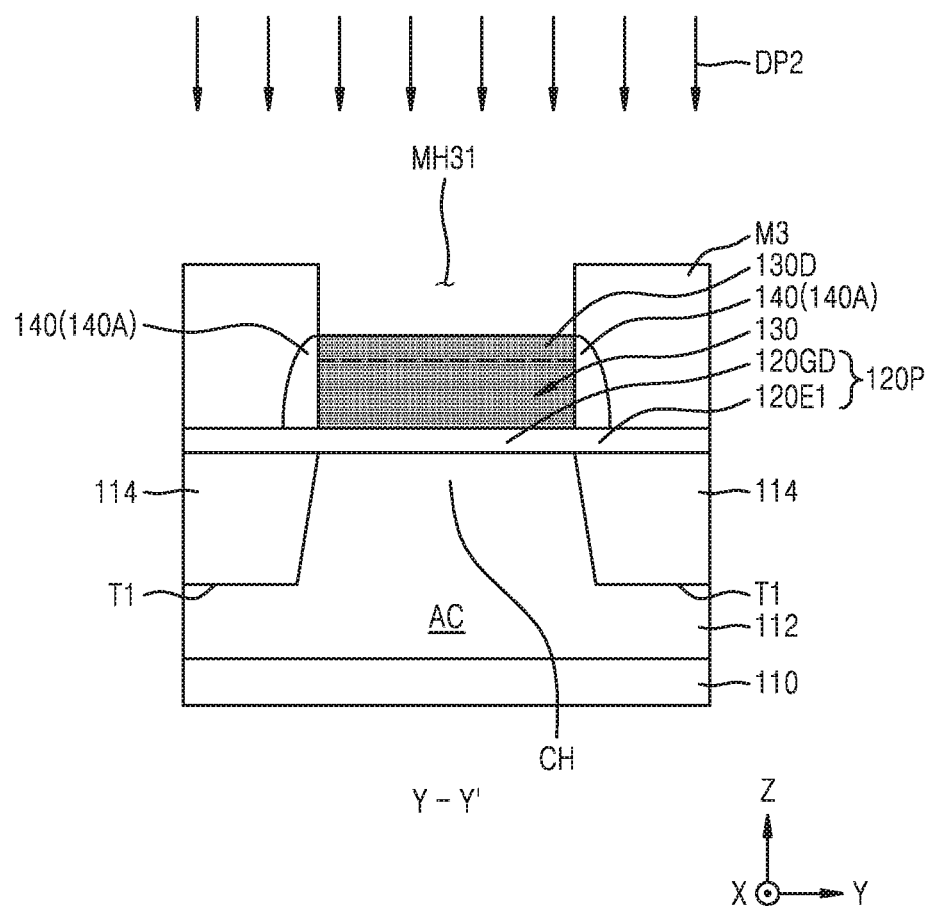

Referring to FIGS. 13A and 13B, a mask pattern M3 is formed on an entire surface of a resultant product/structure in which the insulating spacer 140 is formed. The mask pattern M3 may include a first hole MH31 exposing the top surface of the gate electrode 130, and a plurality of second holes MH32 respectively over the pair of source/drain regions 116, the plurality of second holes MH32 exposing the second extension insulating portion 120E2 of the insulating film pattern 120P. In some embodiments, the mask pattern M3 may include a photoresist pattern.

Next, impurity ions DP2 of the second conductivity type are implanted into the gate electrode 130 and the pair of source/drain regions 116 at a relatively high concentration through the first hole MH31 and the plurality of second holes MH32. As a result, the high-concentration doped region 130D may be formed in the upper portion of the gate electrode 130, and the high-concentration doped region 116H may be formed in the upper portion of each of the pair of source/drain regions 116. The impurity concentration in the high-concentration doped region 116H may be greater than the impurity concentration in other regions of each of the pair of source/drain regions 116. In some embodiments, the impurity ions DP2 implanted into the gate electrode 130 and the pair of source/drain regions 116 may include phosphorus (P) ions.

While the impurity ions DP2 are implanted into the gate electrode 130 through the first hole MH31, since the first extension insulating portion 120E1 having a relatively higher thickness than the second extension insulating portion 120E2, and the first spacer portion 140A of the insulating spacer 140 are on (e.g., cover), in this stated order, the interface between the active region AC and the device isolation film 114, and surroundings thereof, the first extension insulating portion 120E1 and the first spacer portion 140A function as a blocking film impeding/preventing impurity diffusion into the substrate 110, whereby undesired diffusion of the impurity ions into the active region AC may be impeded/prevented. Therefore, since formation of an undesired impurity diffusion region at an edge of a portion of the active region AC between the pair of source/drain regions 116 may be impeded/prevented, the edge being adjacent to the device isolation film 114, problems such as short-circuit of the pair of source/drain regions 116 via the edge of the active region AC may be inhibited/prevented.

In addition, while the impurity ions DP2 are implanted into the pair of source/drain regions 116 through plurality of second holes MH32, the second extension insulating portion 120E2 on (e.g., covering) the pair of source/drain regions 116 may protect the substrate 110 and thus inhibit/prevent damage to a surface of the substrate 110.

Figure 14A:
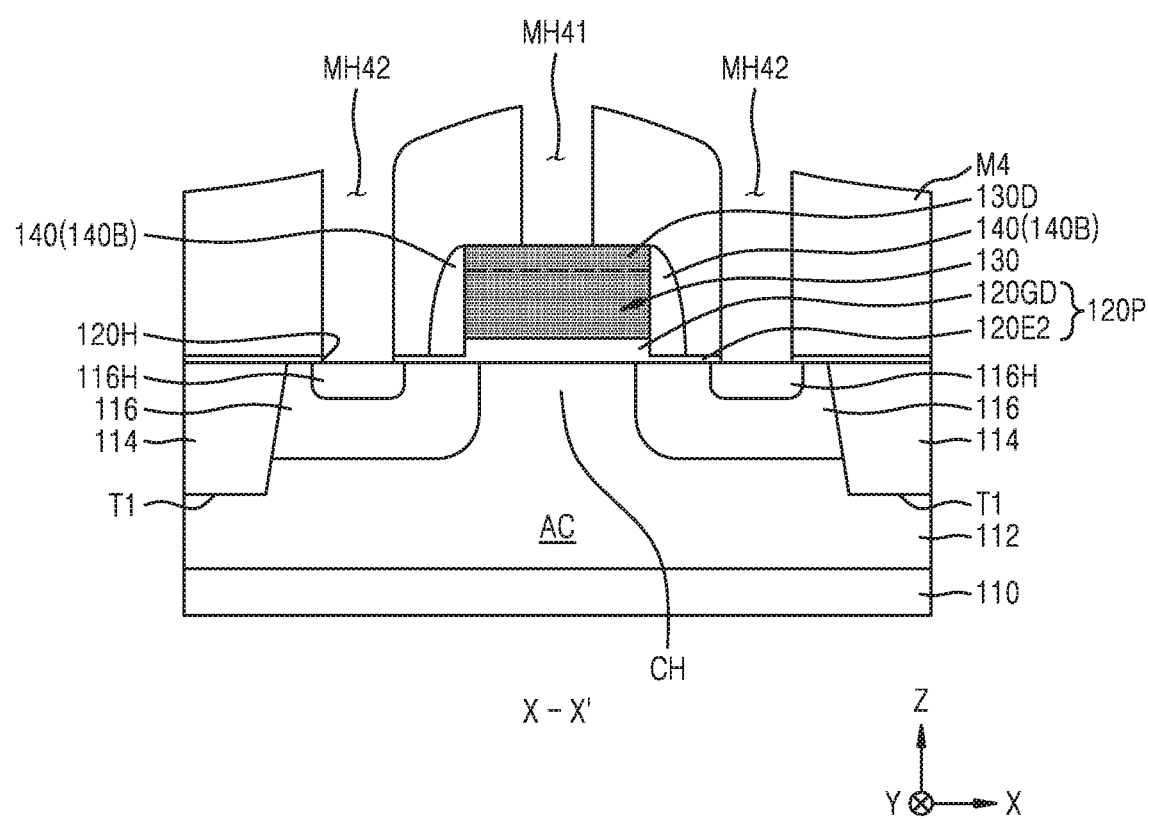
Figure 14B:
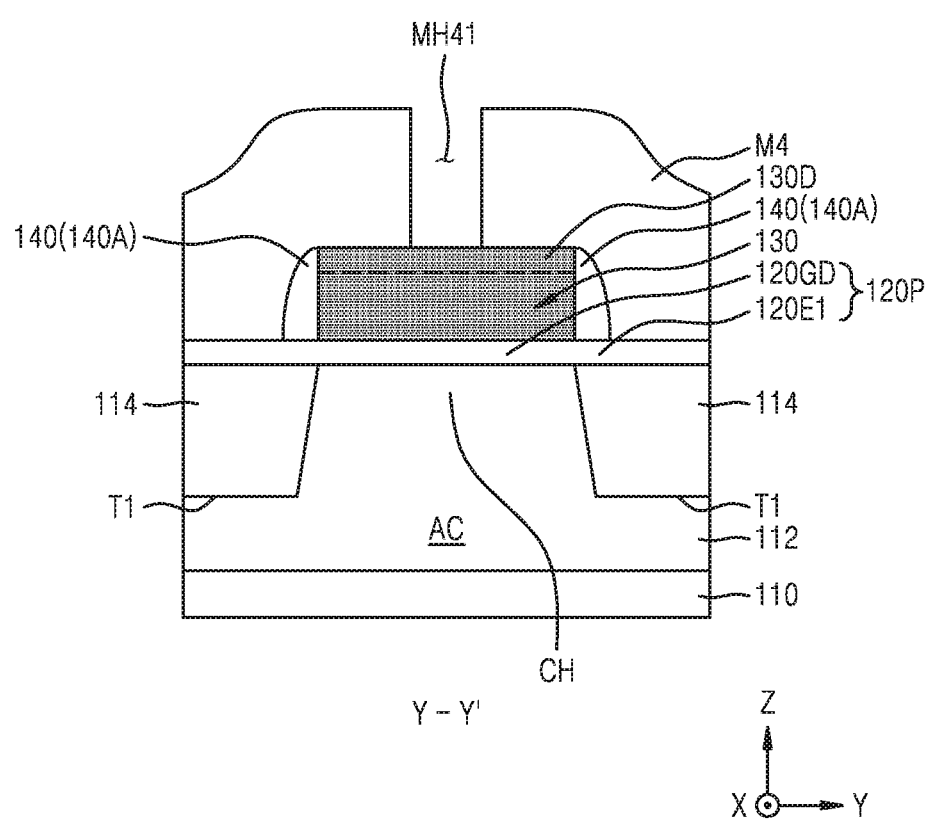

Referring to FIGS. 14A and 14B, the mask pattern M3 is removed from a resultant product/structure of FIGS. 13A and 13B, followed by forming a mask pattern M4 over the substrate 110. The mask pattern M4 may include a first hole MH41 exposing a portion of the top surface of the gate electrode 130, a plurality of second holes MH42 over the pair of source/drain regions 116, the plurality of second holes MH42 exposing the second extension insulating portion 120E2 of the insulating film pattern 120P. In some embodiments, the mask pattern M4 may include an oxide film, a nitride film, or combinations thereof.

Next, portions of the second extension insulating portion 120E2 of the insulating film pattern 120P, which are exposed by the plurality of second holes MH42, are removed by using the mask pattern M4 as an etch mask, thereby exposing the high-concentration doped region 116H by the plurality of second holes MH42. As a result, an opening 120H may be formed in the second extension insulating portion 120E2 of the insulating film pattern 120P, the opening 120H exposing the high-concentration doped region 116H on each of the pair of source/drain regions 116.

Figure 15A:
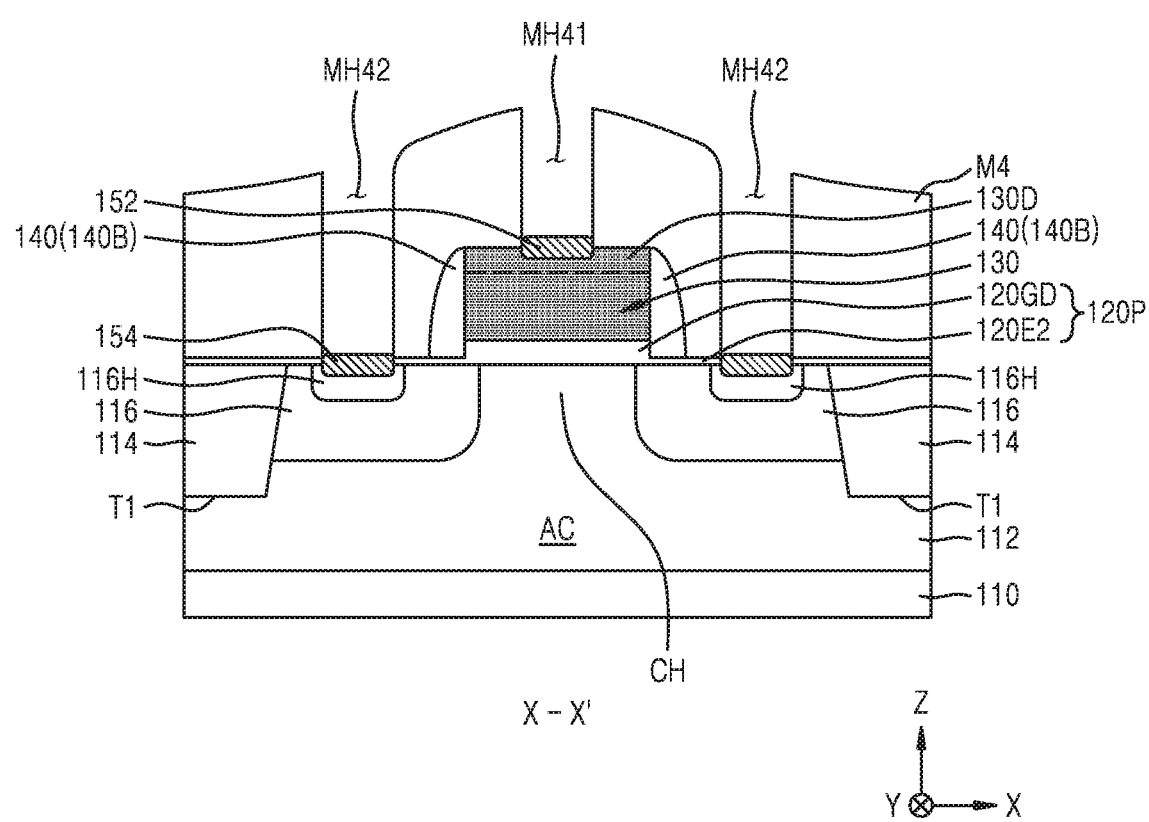
Figure 15B:
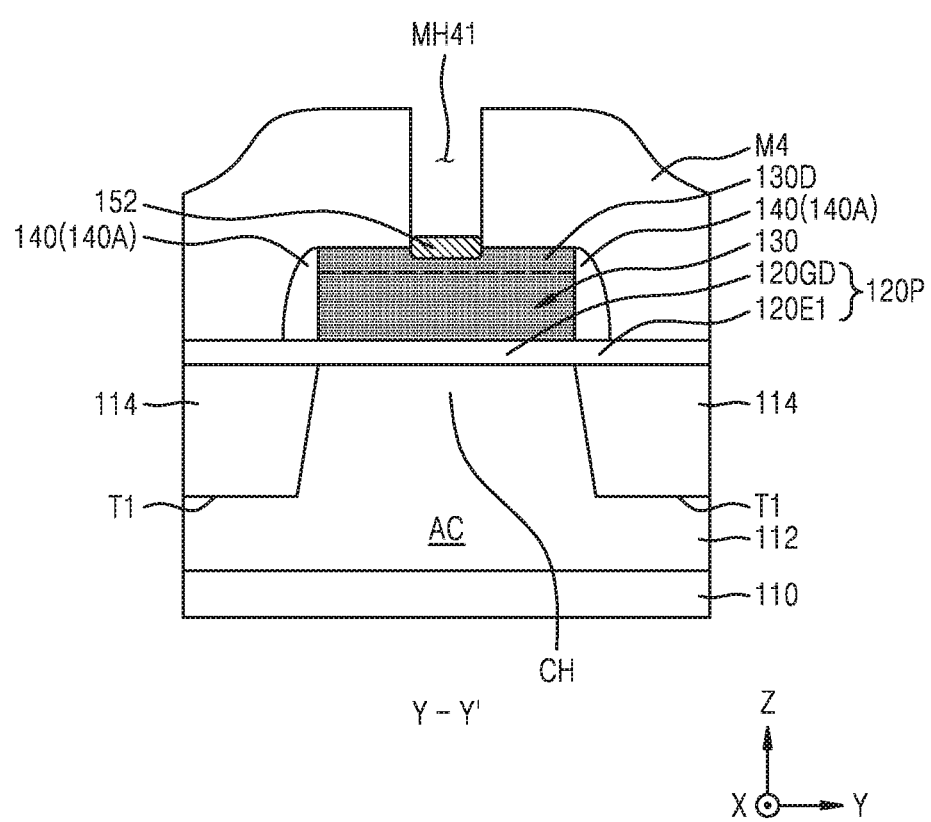

Referring to FIGS. 15A and 15B, by a silicide/salicide process, a first metal silicide film 152 is formed on the top surface of the gate electrode 130 exposed by the first hole MH41 of the mask pattern M4, and a second metal silicide film 154 is formed on a top surface of the high-concentration doped region 116H exposed by the plurality of second holes MH42 of the mask pattern M4.

In some embodiments, each of the first metal silicide film 152 and the second metal silicide film 154 may include titanium (Ti) silicide, cobalt (Co) silicide, or nickel (Ni) silicide, but are not limited thereto.

During the silicide/salicide process for forming the first metal silicide film 152 and the second metal silicide film 154, since the first extension insulating portion 120E1 having a relatively higher thickness than the second extension insulating portion 120E2, and the first spacer portion 140A of the insulating spacer 140 overlap (e.g., cover), in this stated order, the interface between the active region AC and the device isolation film 114, and surroundings thereof, the first extension insulating portion 120E1 and the first spacer portion 140A may function as a blocking film inhibiting/preventing an atmosphere gas of the silicide/salicide process from penetrating into the active region AC. Thus, formation of a metal silicide film on an undesired portion of the active region AC may be inhibited/prevented. For example, the border between the uppermost surface of the active region AC and the device isolation film 114 may be free of metal silicide, as the border may be protected by the first extension insulating portion 120E1 and the first spacer portion 140A. Therefore, since formation of an undesired metal silicide film at an edge of a portion of the active region AC may be inhibited/prevented, the edge being adjacent to the device isolation film 114, problems such as short-circuit of the pair of source/drain regions 116 via the edge of the active region AC may be inhibited/prevented.

Figure 16A:
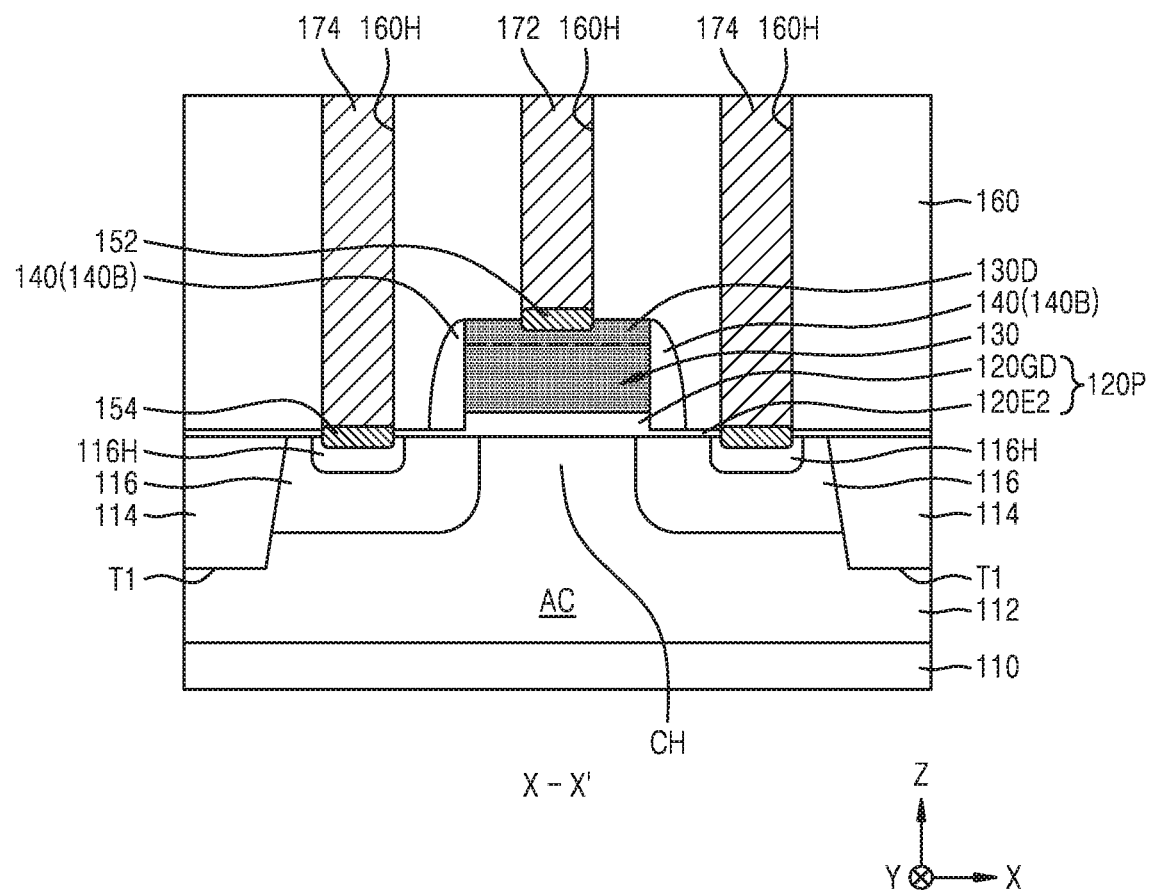
Figure 16B:
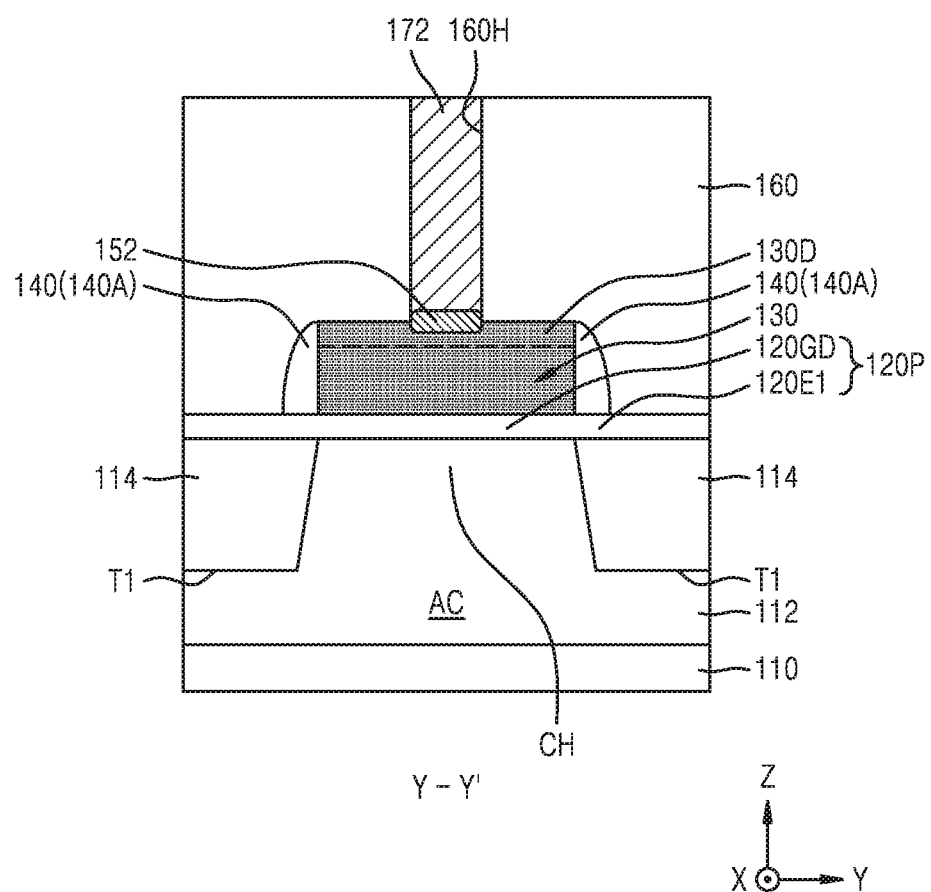

Referring to FIGS. 16A and 16B, the first extension insulating portion 120E1 and the second extension insulating portion 120E2 of the insulating film pattern 120P, the gate electrode 130, the first metal silicide film 152, and the second metal silicide film 154 are exposed by removing the mask pattern M4 from a resultant product/structure of FIGS. 15A and 15B, followed by forming the interlayer dielectric 160, which is on (e.g., which covers) the components set forth above. The interlayer dielectric 160 may include an oxide film, a nitride film, or combinations thereof.

Next, a plurality of contact holes 160H are formed through the interlayer dielectric 160 to expose the first metal silicide film 152 and the second metal silicide film 154, followed by partially or completely filling the plurality of contact holes 160H with a conductive material, thereby forming the gate contact plug 172 and the plurality of source/drain contact plugs 174. In some embodiments, each of the gate contact plug 172 and the plurality of source/drain contact plugs 174 may include a stack structure including a conductive barrier film and a metal plug. The conductive barrier film may include Ti, TiN, or combinations thereof, and the metal plug may include tungsten (W), but are not limited thereto.

Heretofore, although the method of fabricating the integrated circuit device 100 shown in FIGS. 1A to 1C has been described with reference to FIGS. 6A to 16B, integrated circuit devices having various structures, which are modified and changed based on the descriptions made with reference FIGS. 6A to 16B without departing from the spirit and scope of the inventive concepts, may be fabricated.

Figure 17A:
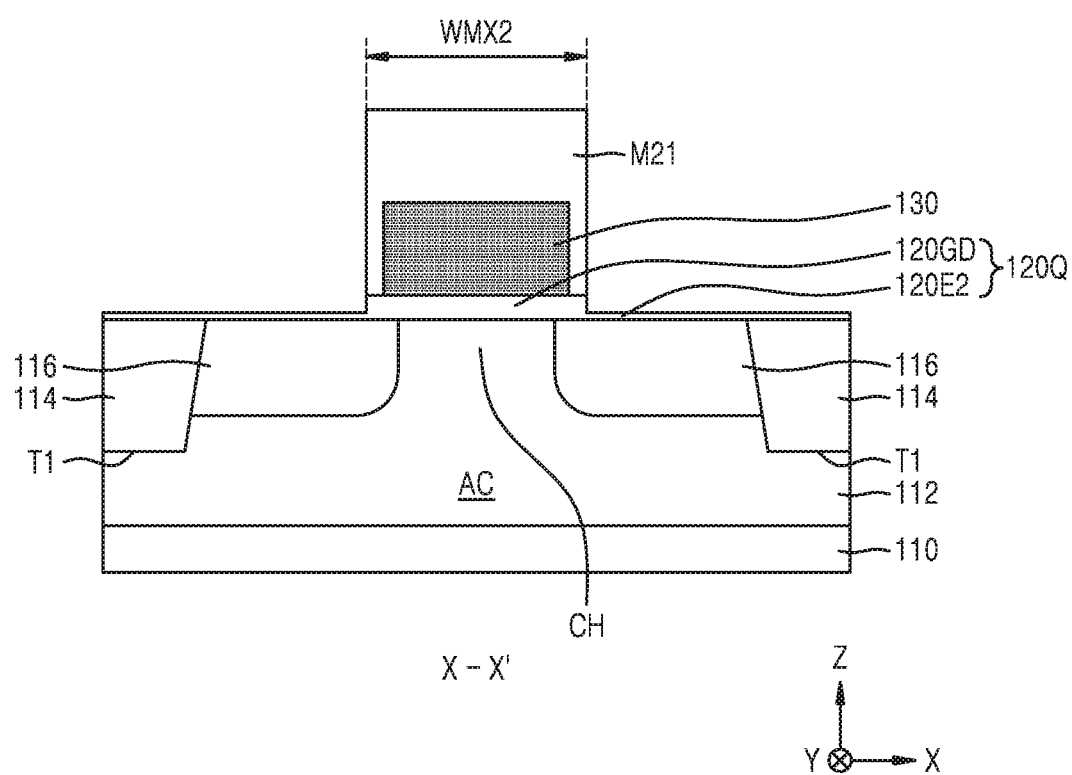
FIG. 17A is a cross-sectional view illustrating an example method of fabricating the integrated circuit device shown in FIG. 2.
Figure 17B:
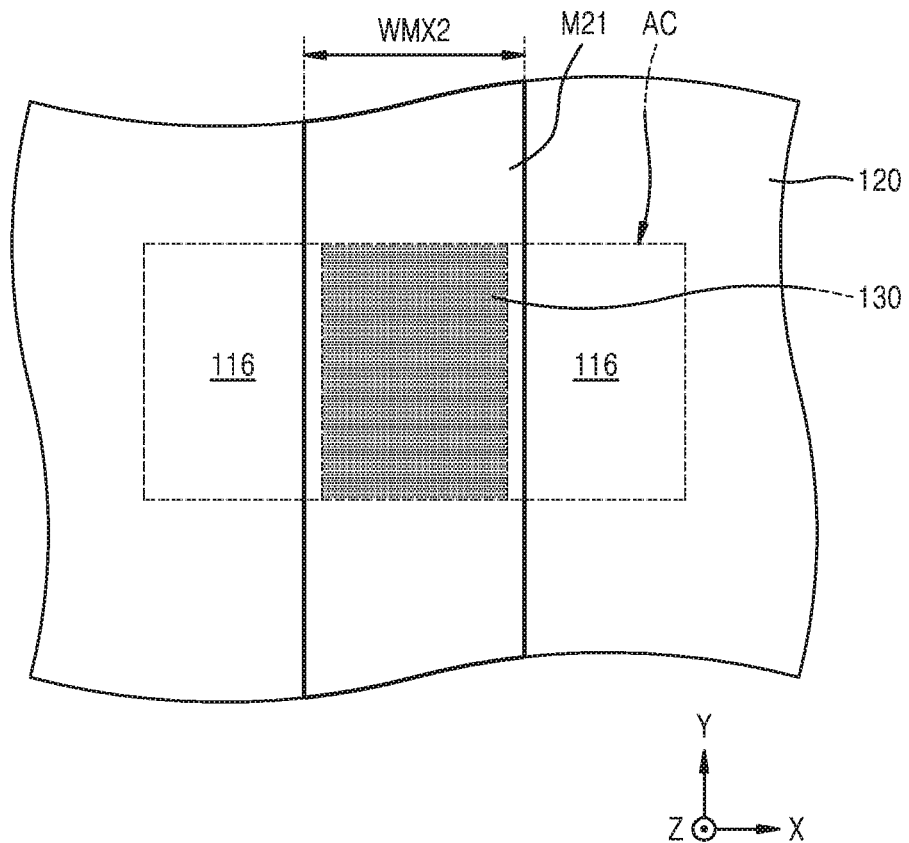
FIG. 17B is a plan view illustrating a planar structure of some components shown in FIG. 17A.

FIGS. 17A and 17B are diagrams illustrating an example method of fabricating the integrated circuit device 200 shown in FIG. 2. In particular, FIG. 17A is a cross-sectional view illustrating some of processes of fabricating the integrated circuit device 200, and FIG. 17B is a plan view illustrating a planar structure of some components shown in FIG. 17A. In FIG. 17B, for better understanding, the pair of source/drain regions 116 and the gate electrode 130 are marked by dashed lines.

Referring to FIGS. 17A and 17B, to fabricate the integrated circuit device 200 shown in FIG. 2, a method similar to that described with reference to FIGS. 6A to 16B may be used. However, instead of the mask pattern M2 having the structure described with reference to FIGS. 10A to 10C, a mask pattern M21 may be formed.

In the X direction (second horizontal direction), the mask pattern M21 may have a width WMX2 that is greater than the width of the gate electrode 130. In the X direction (second horizontal direction), the mask pattern M21 may be formed on (e.g., to cover) opposite sidewalls of the gate electrode 130. The mask pattern M21 may include a photoresist pattern, but is not limited thereto.

After the mask pattern M21 is formed, the insulating film 120 (see FIGS. 10A and 10B) exposed around the mask pattern M21 may be etched as much as a certain/predetermined thickness in a similar manner to that described with reference to FIGS. 11A and 11B by using the mask pattern M21 as an etch mask, thereby forming the insulating film pattern 120Q, in which portions of the insulating film 120 are reduced in height, the portions overlapping (e.g., covering) the pair of source/drain regions 116.

Next, the mask pattern M21 may be removed, followed by performing the processes described with reference to FIGS. 12A to 16B, thereby fabricating the integrated circuit device 200 shown in FIG. 2.

To fabricate the integrated circuit device 300 shown in FIGS. 3A and 3B, a method similar to that described with reference to FIGS. 6A to 16B may be used. However, in the process described with reference to FIGS. 9A and 9B, instead of the gate electrode 130, the gate electrode 330 shown in FIGS. 3A and 3B may be formed. Next, the processes described with reference to FIGS. 10A to 16B may be performed, thereby fabricating the integrated circuit device 300 shown in FIGS. 3A and 3B.

To fabricate the integrated circuit device 400 shown in FIGS. 4A and 4B, a method similar to that described with reference to FIGS. 6A to 16B may be used. However, in the process described with reference to FIGS. 9A and 9B, instead of the gate electrode 130, the gate electrode 430 shown in FIGS. 4A and 4B may be formed. Next, the processes described with reference to FIGS. 10A to 16B may be performed, thereby fabricating the integrated circuit device 400 shown in FIGS. 4A and 4B.

To fabricate the integrated circuit device 500 shown in FIG. 5, the first transistor TR5A and the second transistor TR5B adjacent to each other may be formed on the substrate 110 by a method similar to that described with reference to FIGS. 6A to 16B.

Figure 18:
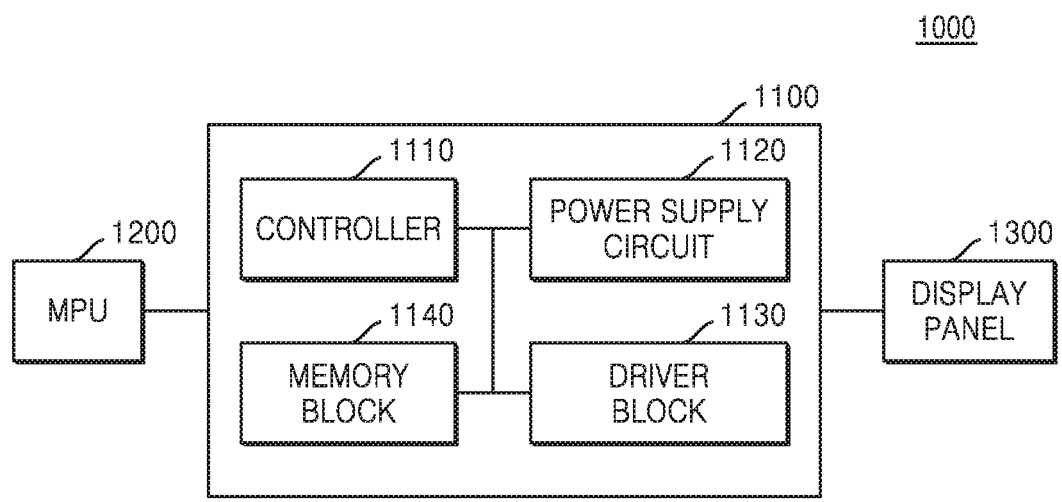
FIG. 18 is a schematic block diagram of a display device according to some embodiments of the inventive concepts.

FIG. 18 is a schematic block diagram of a display device 1000 according to some embodiments of the inventive concepts.

Referring to FIG. 18, the display device 1000 includes a display driver integrated circuit (DDI) 1100.

The DDI 1100 may include a controller 1110, a power supply circuit 1120, a driver block (e.g., driver device(s)) 1130, and a memory block (e.g., memory device(s)) 1140. The controller 1110 may receive and decode a command applied from a main processing unit (MPU) 1200, and may control each block of the DDI 1100 to implement an operation according to the command. The power supply circuit 1120 may generate a driving voltage in response to the control of the controller 1110. The driver block 1130 may drive a display panel 1300 by using the driving voltage generated by the power supply circuit 1120 in response to the control of the controller 1110. The display panel 1300 may be a liquid crystal display panel or a plasma display panel. The memory block 1140 may temporarily store commands input to the controller 1110, or control signals output from the controller 1110, or may store required data. The memory block 1140 may include memory such as random access memory (RAM) or read-only memory (ROM). The power supply circuit 1120 and the driver block 1130 may each include one of the integrated circuit devices 100, 200, 300, 400, and 500 described with reference to FIGS. 1A to 5, the integrated circuit devices 100, 200, 300, 400, and 500 each including a high-voltage transistor. The controller 1110 and the memory block 1140 may each include a low-voltage transistor operated at a lower voltage than the high-voltage transistor included each of the integrated circuit devices 100, 200, 300, 400, and 500.

Although example embodiments of the inventive concepts have been described in detail, the inventive concepts are not limited to the example embodiments and may be variously modified and changed by one of ordinary skill in the art without departing from the spirit and scope of the inventive concepts. For example, although the example embodiments of the inventive concepts have been described by taking a high-voltage transistor as an example, the inventive concepts may be applied to a low-voltage transistor.

While the inventive concepts have been particularly shown and described with reference to embodiments thereof, it will be understood that various changes in form and details may be made therein without departing from the spirit and scope of the following claims.

What is claimed is:

1. An integrated circuit device comprising:
a substrate;

a device isolation film on the substrate, wherein an active region of the substrate is defined by the device isolation film on the substrate and comprises a first width in a horizontal direction;

a pair of source/drain regions in the active region;

a gate electrode over a portion of the active region that is between the pair of source/drain regions, the gate electrode comprising a second width equal to or less than the first width of the active region in the horizontal direction;

an insulating spacer comprising a first spacer portion over the device isolation film and a second spacer portion over the active region, wherein the first spacer portion and the second spacer portion are on first and second sidewalls, respectively, of the gate electrode; and an insulating film comprising a gate insulating portion between the active region and the gate electrode, wherein the first sidewall of the gate electrode comprises one among a pair of first sidewalls at opposite ends of the gate electrode in the horizontal direction, and wherein a pair of vertical axes vertically aligned with the pair of first sidewalls, respectively, intersects border regions between the device isolation film and a top surface of the active region.

2. The integrated circuit device according to claim 1, wherein the first and second sidewalls of the gate electrode are perpendicular to each other.

3. The integrated circuit device according to claim 1,
wherein a first vertical length of the first spacer portion is less than a second vertical length of the second spacer portion, and
wherein the first spacer portion is integrally connected to the second spacer portion.

4. The integrated circuit device according to claim 1,
wherein the insulating film further comprises:
a first extension insulating portion integrally connected to the gate insulating portion and intervening between, in a vertical direction, the first spacer portion and the device isolation film; and
a second extension insulating portion integrally connected to the gate insulating portion and intervening between, in the vertical direction, the second spacer portion and the active region, and
wherein a thickness in the vertical direction of the first extension insulating portion is different from a thickness in the vertical direction of the second extension insulating portion.

5. The integrated circuit device according to claim 4,
wherein the thickness in the vertical direction of the first extension insulating portion is greater than the thickness in the vertical direction of the second extension insulating portion.

6. The integrated circuit device according to claim 4, wherein the insulating film further comprises a stepped portion comprising a transition between the gate insulating portion and the second extension insulating portion.

7. The integrated circuit device according to claim 4, further comprising:
an interlayer dielectric on the pair of source/drain regions and the second extension insulating portion; and
a plurality of conductive contact plugs penetrating the interlayer dielectric and electrically connected to the pair of source/drain regions.

8. An integrated circuit device comprising:
a substrate comprising a trench region that defines an active region of the substrate, the active region comprising a first width in a first horizontal direction;

a device isolation film in the trench region;

a gate electrode over the active region, the gate electrode comprising a second width equal to or less than the first width of the active region in the first horizontal direction;

an insulating spacer over the active region and the device isolation film, wherein the insulating spacer is on sidewalls of the gate electrode;

a pair of source/drain regions in the active region, the pair of source/drain regions being spaced apart from each other, wherein the gate electrode overlaps a portion of the active region that is between the pair of source/drain regions; and an insulating film on the active region and the device isolation film, the insulating film comprising a gate insulating portion between the active region and the gate electrode, wherein a vertical axis that extends through a border between an uppermost surface of the active region and the device isolation film in a vertical direction that is perpendicular to the first horizontal direction is vertically aligned with one of the sidewalls of the gate electrode or extends through the insulating spacer.

9. The integrated circuit device according to claim 8, wherein the vertical axis extends through the insulating spacer.

10. The integrated circuit device according to claim 8, wherein the sidewalls of the gate electrode comprise:
a pair of first sidewalls at opposite ends of the gate electrode in the first horizontal direction; and
a pair of second sidewalls at opposite ends of the gate electrode in a second horizontal direction that intersects the first horizontal direction, and
wherein each of the pair of first sidewalls and each of the pair of second sidewalls overlaps the uppermost surface of the active region.

11. The integrated circuit device according to claim 8, wherein a vertical length of a first portion of the insulating spacer over the device isolation film is less than a vertical length of a second portion of the insulating spacer over one of the pair of source/drain regions.

12. The integrated circuit device according to claim 8,
wherein the insulating film further comprises:
a first extension insulating portion integrally connected to the gate insulating portion and on the device isolation film; and
a second extension insulating portion integrally connected to the gate insulating portion and on the pair of source/drain regions, the second extension insulating portion comprising a plurality of openings over respective areas of the pair of source/drain regions,
wherein the integrated circuit device further comprises metal silicide on the respective areas of the pair of source/drain regions,
wherein the border between the uppermost surface of the active region and the device isolation film is free of metal silicide, and
wherein a thickness of the first extension insulating portion is different from a thickness of the second extension insulating portion.

13. The integrated circuit device according to claim 8, wherein the sidewalls of the gate electrode comprise:
a pair of first sidewalls at opposite ends of the gate electrode in the first horizontal direction; and a pair of second sidewalls at opposite ends of the gate electrode in a second horizontal direction that intersects the first horizontal direction, wherein the insulating spacer is on each of the pair of first sidewalls and on each of the pair of second sidewalls, and wherein the device isolation film extends continuously around the insulating spacer.

14. An integrated circuit device comprising:
a substrate comprising a first active region and a second active region that are adjacent each other and spaced apart from each other in a first horizontal direction;
a device isolation region between the first active region and the second active region;
a first plurality of impurity diffusion regions in the first active region;
a second plurality of impurity diffusion regions in the second active region;
a first gate electrode over the first active region, the first gate electrode comprising a width equal to or less than a width of the first active region in the first horizontal direction;
a first insulating spacer on sidewalls of the first gate electrode and on the device isolation region;
a second gate electrode over the second active region, the second gate electrode comprising a width equal to or less than a width of the second active region in the first horizontal direction; and
a second insulating spacer on sidewalls of the second gate electrode and on the device isolation region,
wherein a separation distance between the first active region and the second active region in the first horizontal direction is constant along a second horizontal direction that is perpendicular to the first horizontal direction,
wherein a distance between the first gate electrode and the second gate electrode in the first horizontal direction is equal to or greater than the separation distance, and
wherein a first portion of the first insulating spacer and a second portion of the second insulating spacer overlap a top surface of the device isolation region.

15. The integrated circuit device according to claim 14, wherein first vertical lengths of portions of the first insulating spacer and the second insulating spacer over the device isolation region are different from second vertical lengths of other portions of the first insulating spacer and the second insulating spacer over the first plurality of impurity diffusion regions and the second plurality of impurity diffusion regions.

16. The integrated circuit device according to claim 14, further comprising:
an insulating film comprising a gate insulating portion between the first active region and the first gate electrode,
wherein a first thickness of the insulating film on the device isolation region is different from second thicknesses of the insulating film on the first plurality of impurity diffusion regions and the second plurality of impurity diffusion regions.

17. The integrated circuit device according to claim 14,
wherein a first vertical axis that extends through a border between the first active region and the device isolation region in a vertical direction that is perpendicular to the first horizontal direction is vertically aligned with one of the sidewalls of the first gate electrode or extends through the first insulating spacer,
wherein the sidewalls of the first gate electrode comprise four sidewalls,
wherein the first insulating spacer is on each of the four sidewalls of the first gate electrode, and
wherein a second vertical axis that extends through a border between the second active region and the device isolation region in the vertical direction is vertically aligned with one of the sidewalls of the second gate electrode or extends through the second insulating spacer.

18. The integrated circuit device according to claim 14, wherein the device isolation region extends continuously around the first insulating spacer and the second insulating spacer.

* * * * *